(12) United States Patent
Kang

(10) Patent No.: US 6,317,355 B1
(45) Date of Patent: Nov. 13, 2001

(54) NONVOLATILE FERROELECTRIC MEMORY DEVICE WITH COLUMN REDUNDANCY CIRCUIT AND METHOD FOR RELIEVING FAILED ADDRESS THEREOF

(75) Inventor: Hee Bok Kang, Daejeon-si (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/661,650

(22) Filed: Sep. 13, 2000

(30) Foreign Application Priority Data

Sep. 15, 1999 (KR) .............................................. P99-39595

(51) Int. Cl.[7] .................................................. G11C 11/22
(52) U.S. Cl. ........................ 365/145; 365/200; 365/205; 365/210
(58) Field of Search ................................... 365/145, 200, 365/205, 207, 208, 210

(56) References Cited

U.S. PATENT DOCUMENTS

| | | | |
|---|---|---|---|
| 4,873,664 | 10/1989 | Eaton, Jr. ............................. | 365/145 |
| 5,347,484 | * 9/1994 | Kwong et al. .......................... | 365/49 |
| 5,680,344 | 10/1997 | Seyyedy ................................ | 365/145 |
| 5,973,970 | * 10/1999 | Sugibayashi .......................... | 365/200 |
| 6,154,389 | * 11/2000 | Chung et al. ..................... | 365/185.09 |
| 6,172,921 | * 1/2001 | Park et al. ............................ | 365/200 |
| 6,201,744 | * 3/2001 | Takahashi ............................. | 365/200 |

* cited by examiner

Primary Examiner—Son Mai
(74) Attorney, Agent, or Firm—Fleshner & Kim, LLP

(57) ABSTRACT

A nonvolatile ferroelectric memory device with a column redundancy circuit and method for relieving a failed address thereof has a reduced size and increased speed of operations. The nonvolatile ferroelectric memory device with a column redundancy circuit and method uses one amplifier for each of main or redundant data reading and writing operations. The nonvolatile ferroelectric memory device with a column redundancy circuit can include a main cell array block and column reference cell array block having cell arrays with split wordlines and bitlines perpendicular to the wordlines. A redundancy cell array block has the same configuration as the main cell array block. First, second and third sensing amplifiers of a main amplifier amplify bitline signals of the main cell array block at three stages using a first common data bus both for data reading and writing operations. First, second and third redundancy sensing amplifiers amplify bitline signals of the redundancy cell array block at three stages using a second common data bus for both data reading and writing operations. A column redundancy driving circuit relieves the failed column address of the main cell array block by substituting the failed column for a column of the redundancy cell array block when a failure of the column address of the main cell array occurs. An input/output buffer transmits the relieved column data to an input/output pad.

26 Claims, 23 Drawing Sheets

E:electric field
P:polarity

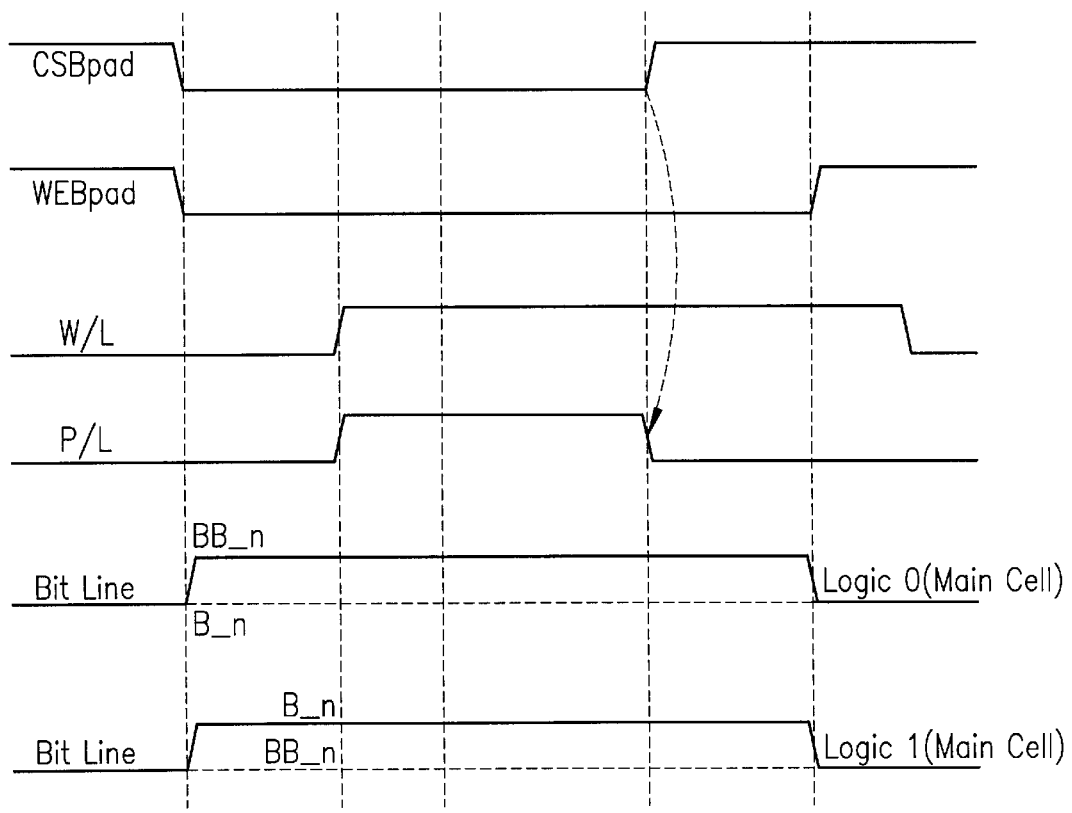

NONVOLATILE FERROELECTRIC MEMORY DEVICE WITH COLUMN REDUNDANCY CIRCUIT AND METHOD FOR RELIEVING FAILED ADDRESS THEREOF

BACKGROUND OF THE INVENTION

1. Field of the Invention

The present invention relates to a semiconductor memory device, and more particularly, to a nonvolatile ferroelectric memory device with a column redundancy circuit and method for using same.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and second terminal is connected with the plate line P/L.

The data input/output operation of the related art nonvolatile ferroelectric memory device will now be described. FIG. 3a is a timing chart illustrating the operation of the write mode of the related art nonvolatile ferroelectric memory device, and FIG. 3b is a timing chart illustrating the operation of read mode thereof.

During the write mode, an externally applied chip enable signal CSBpad is activated from high state to low state. At the same time, if a write enable signal WEBpad is applied from high state to low state, the write mode starts. Subsequently, if address decoding in the write mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. A low signal is applied to the bitline, and if the signal applied to the plate line is high, a logic value "0" is written in the ferroelectric capacitor.

With reference to FIG. 3b, the reading operation of data stored in a cell by the above operation of the write mode will now be described. If an externally applied chip enable signal CSBpad is activated from high state to low state, all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data corresponding to the logic value "1" stored in the ferroelectric memory. If the logic value "0" is stored in the ferroelectric memory, the corresponding data is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in hysteresis loop of FIG. 1. If the data is not destroyed, "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data, to recover the data to the original data, the plate line becomes inactive from high state to low state at the state that the high signal is applied to the corresponding wordline.

FIG. 4 is a block diagram showing the related art nonvolatile ferroelectric memory device having a cell structure of 1T/1C. As shown in FIG. 4, the related art nonvolatile ferroelectric memory device includes a main cell array 41, a reference cell array 42 assigned on a lower part of the main cell array 41, a wordline driver 43 formed at a side of the main cell array for applying a driving signal to the main cell array 41 and the reference cell array 42, and a sensing amplifier 44 formed at a lower part of the reference cell array 42.

The wordline driver 43 applies the driving signal to a main wordline of the main cell array 41 and a reference wordline of the reference cell array 42. The sensing amplifier 44 includes a plurality of sensing amplifiers and amplifies signals of a corresponding bitline B/L and bit bar line BB/L.

The operation of the related art nonvolatile ferroelectric memory device will now be described with reference to FIG. 5. FIG. 5 is a partially detailed view of FIG. 4. As shown in the drawing, the main cell array has a folded bitline structure in the same manner as DRAM.

Also, the reference cell array 42 has a folded bitline structure and includes a reference cell wordline and a reference cell plate line in pairs. At this time, reference cell wordline and the reference cell plate line pairs are defined as RWL_N−1 and RPL_N−1, and RWL_N and RPL_N, respectively.

When the main cell wordline WL_N−1 and the main cell plate line PL_N−1, are activated, the reference cell wordline RWL_N−1 and the reference cell plate line RPL_N−1 are activated. Therefore, data in the main cell is loaded into the bitline B/L and data in the reference cell is loaded into the bit bar line BB/L.

When the main cell wordline WL_N and the main cell plate line PL_N are activated, the reference cell wordline RWL_N and the reference cell plate line RPL_N are activated. Therefore, data in the main cell is loaded into the bit bar line BB/L and data in the reference cell is loaded into the bitline B/L.

The reference voltage REF by the reference cell exists between the bitline levels B_H(high) and B_L(low) by the main cell. To generate the reference voltage REF between the bitline levels B_H and B_L, the logic value "1" or "0" may be stored in a capacitor of the reference cell. When the logic value "1" is stored in the capacitor of the reference cell, the size of the capacitor of the reference cell is smaller than that of the capacitor of the main cell. When the logic value "0" is stored in the capacitor of the reference cell, the size of the capacitor of the reference cell is greater than that of the capacitor of the main cell.

FIG. 6 is a diagram illustrating one of the plurality of sensing amplifiers constituting the sensing amplifier of FIG. 4. As shown in FIG. 6, the related art sensing amplifier has a structure of a latch type sensing amplifier.

In other words, the sensing amplifier in FIG. 6 includes two PMOS transistors and two NMOS transistors, and these PMOS and NMOS transistors have latch type inverter structures. The first PMOS transistor MP1 and the second PMOS transistor MP2 face each other. An output terminal of the first PMOS transistor MP1 is connected to a gate of the second PMOS transistor MP2, and an output terminal of the second PMOS transistor MP2 is connected to a gate of the first PMOS transistor MP1. An SAP signal is commonly applied to input terminals of the first and second PMOS transistors MP1 and MP2. The SAP signal is an active signal that activates the first and second PMOS transistors MP1 and MP2.

The first NMOS transistor MN1 is connected to the output terminal of the first PMOS transistor MP1 in series. The second NMOS transistor MN2 is connected to the output terminal of the second NMOS transistor MN2 in series. The output terminal of the second NMOS transistor MN2 is connected to a gate of the first NMOS transistor MN1, and the output terminal of the first NMOS transistor MN1 is connected to a gate of the second NMOS transistor MN2.

An SAN signal is commonly applied to input terminals of the first and second NMOS transistors MN1 and MN2. The SAN signal is an active signal that activates the first and second NMOS transistors MN1 and MN2.

The output terminals of the first PMOS transistor MP1 and first NMOS transistor MN1 are commonly connected to the bitline B_N. The output terminals of the second PMOS transistor MP2 and the second NMOS transistor MN2 are connected to the next bitline B_N+1.

The output of the sensing amplifier is respectively connected to the bitlines B_N and B_N+1 to be input and output to the main cell and the reference cell, respectively, thereby enabling input/output to the main cell and the reference cell.

The SAP signal, the SAN signal, and the signals of B_N and B_N+1 are all maintained at ½ Vcc for a precharge period when the sensing amplifier is not active. On the other hand, the SAP signal is pulled-up at high level and the SAN signal is pulled-down at low level.

As described above, the related art nonvolatile ferroelectric memory device has various disadvantages. Since the reading and writing data operations are performed using different data buses, a plurality of data buses are required that make a reduced size, highly integrated layout design difficult. In addition, since sensing amplifier arrays corresponding to cell array blocks are provided, bitline loading is increased. Thus, the related art nonvolatile ferroelectric memory device has limitations in high speed data input/output operations and in reducing a layout area of a chip in the overall array. As a result, it is difficult to efficiently arrange a cell array and a sensing amplifier array. Therefore, it takes an increased time from design of the memory to mass production thereof, which increases costs and reduces product competitiveness. In addition, data reading and writing operations performed using different data buses, reduces such efficiencies when relieving a failed column address.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a nonvolatile ferroelectric memory device with a column redundancy circuit and method for using same that substantially obviates one or more of the problems caused by limitations and disadvantages of the related art.

Another object of the present invention is to provide a nonvolatile ferroelectric memory device with a column redundancy circuit and method for relieving a failed address thereof that uses a common amplifier for data reading and data writing operations.

Another object of the present invention is to provide a nonvolatile ferroelectric memory device with a column redundancy circuit and method in which sensing amplifiers have a reduced layout.

Another object of the present invention is to provide a nonvolatile ferroelectric memory device with a column redundancy circuit and method having a faster operation speed.

Another object of the present invention is to provide a nonvolatile ferroelectric memory device with a column redundancy circuit and method for using same that has an increased speed and decreased bitline loading to efficiently repair a failed column address using a hierarchical amplifier for data reading and writing operations.

To achieve at least these objects and other advantages in a whole or in part and in accordance with the purpose of the present invention, as embodied and broadly described, a nonvolatile ferroelectric memory device with a column redundancy circuit according to the present invention includes main cell array block and column reference cell array block having cell arrays including wordlines of split structures and bitlines perpendicular to the wordlines; a redundancy cell array block having the same configuration as the main cell array block, substituted for a column address of the main cell array block when the column address is failed; first, second and third amplifiers for amplifying bitline signals of the main cell array block at three stages using a data bus commonly used for data reading and writing operation; a first redundancy amplifier for amplifying bitline signals of the redundancy cell array block when the column address of the main cell array block is failed; a first data bus commonly used for data reading and writing operation, for interfacing an output signal of the first redundancy amplifier;

a second redundancy amplifier for amplifying a signal of the first data bus; a second data bus commonly used for data reading and writing operation, for interfacing an output signal of the second redundancy amplifier; a third redundancy amplifier for amplifying a signal of the second data bus; a column redundancy driving circuit for relieving the failed column address of the main cell array block by substituting the failed column for a column of the redundancy cell array block when the column address of the main cell array block is failed; and an input/output buffer for transmitting the relieved column data to an input/output pad.

To further achieve the above objects in a whole or in part according to the present invention, there is provided a nonvolatile ferroelectric memory device that includes main cell array block and a redundancy cell array block having cell arrays including split wordlines and bitlines perpendicular to the split wordlines, wherein the redundancy cell array block corrects a selected failed column address of the main cell array block, an amplifier that amplifies bitline signals of the main cell array block using a first common data bus for data reading and writing operations, a redundancy amplifier that amplifies bitline signals of the redundancy cell array block using a second common data bus for data reading and writing operations and a column redundancy driving circuit coupled to the amplifiers that substitutes a column of the redundancy cell array block responsive to the failed selected column address of the main cell array block.

To further achieve the above objects in a whole or in part according to the present invention, there is provided a column redundancy circuit for a memory device that includes a failed column address coder having a plurality of failed address coding fuse blocks that generate a relief column address active signal coupled to receive a plurality of failed column addresses in a memory array, a failed input/output coder that includes a plurality of input/output coding fuse blocks each corresponding to one of the failed address coding fuse blocks and a relief column adjusting circuit that activates a redundancy column in a redundancy memory array through the active signal and inactivates a failed column of the selected failed column address.

To further achieve the above objects in a whole or in part according to the present invention, there is provided a method for relieving a failed address of a nonvolatile ferroelectric memory device with a column redundancy circuit, wherein the nonvolatile ferroelectric memory has a main cell area and a redundant cell area includes performing chip test after a wafer fabrication process, detecting a failed column address selected in the main cell area, detecting input/output data of the failed column address, generating a failed column address active signal by disabling a address fuse using a failed address fuse coder to code a corresponding failed column address, generating a failed input/output active signal by disabling an input/output fuse using a failed input/output fuse coder to code corresponding failed input/output data, and relieving the failed column address in a corresponding column of the redundant cell area by synthesizing the failed column address active signal and the failed input/output active signal using a relief column adjusting circuit.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 3a is a timing chart illustrating the operation of a write mode of the related art nonvolatile ferroelectric memory device;

DETAILED DESCRIPTION OF PREFERRED EMBODIMENTS

Figure 1:
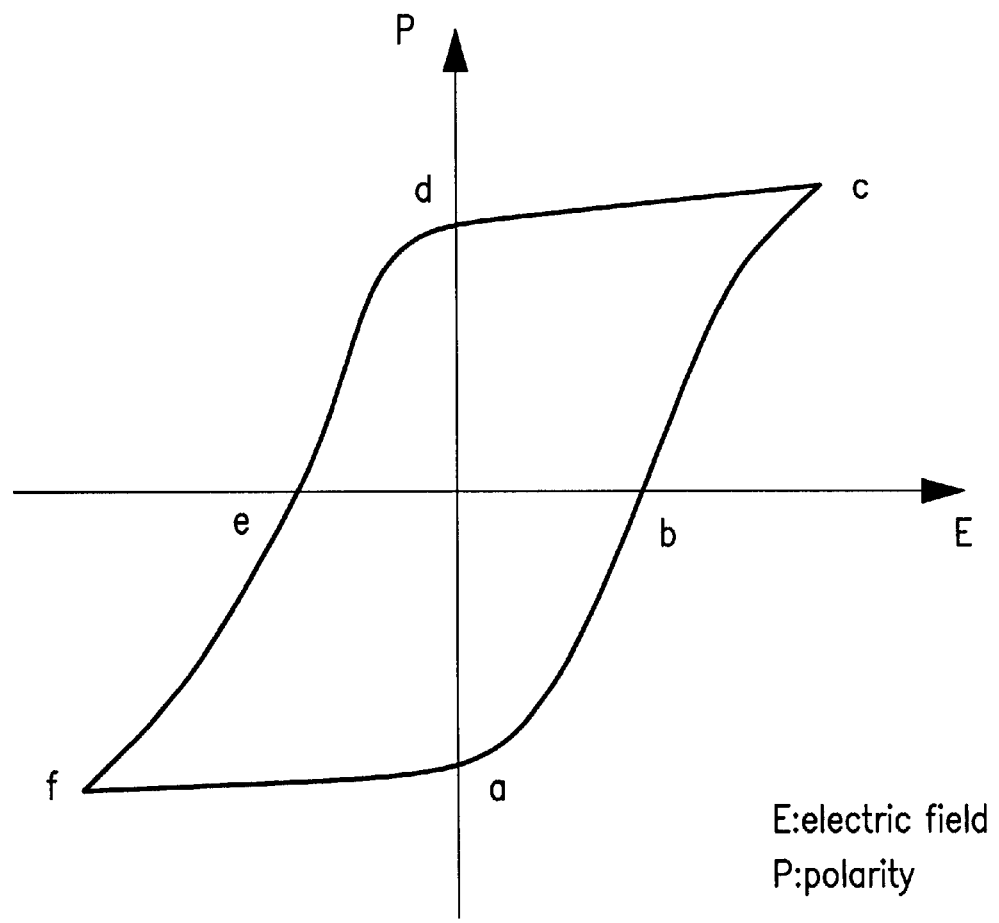
FIG. 1 shows hysteresis loop of a general ferroelectric.
Figure 2:
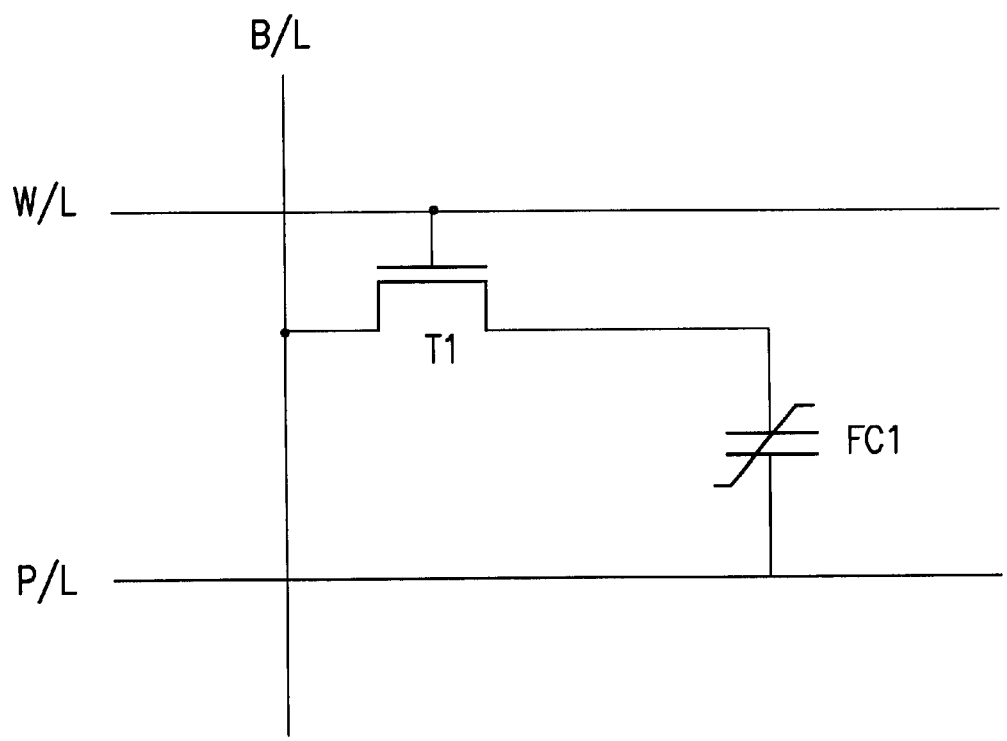
FIG. 2 is a schematic view of a unit cell of a related art nonvolatile ferroelectric memory.
Figure 3B:
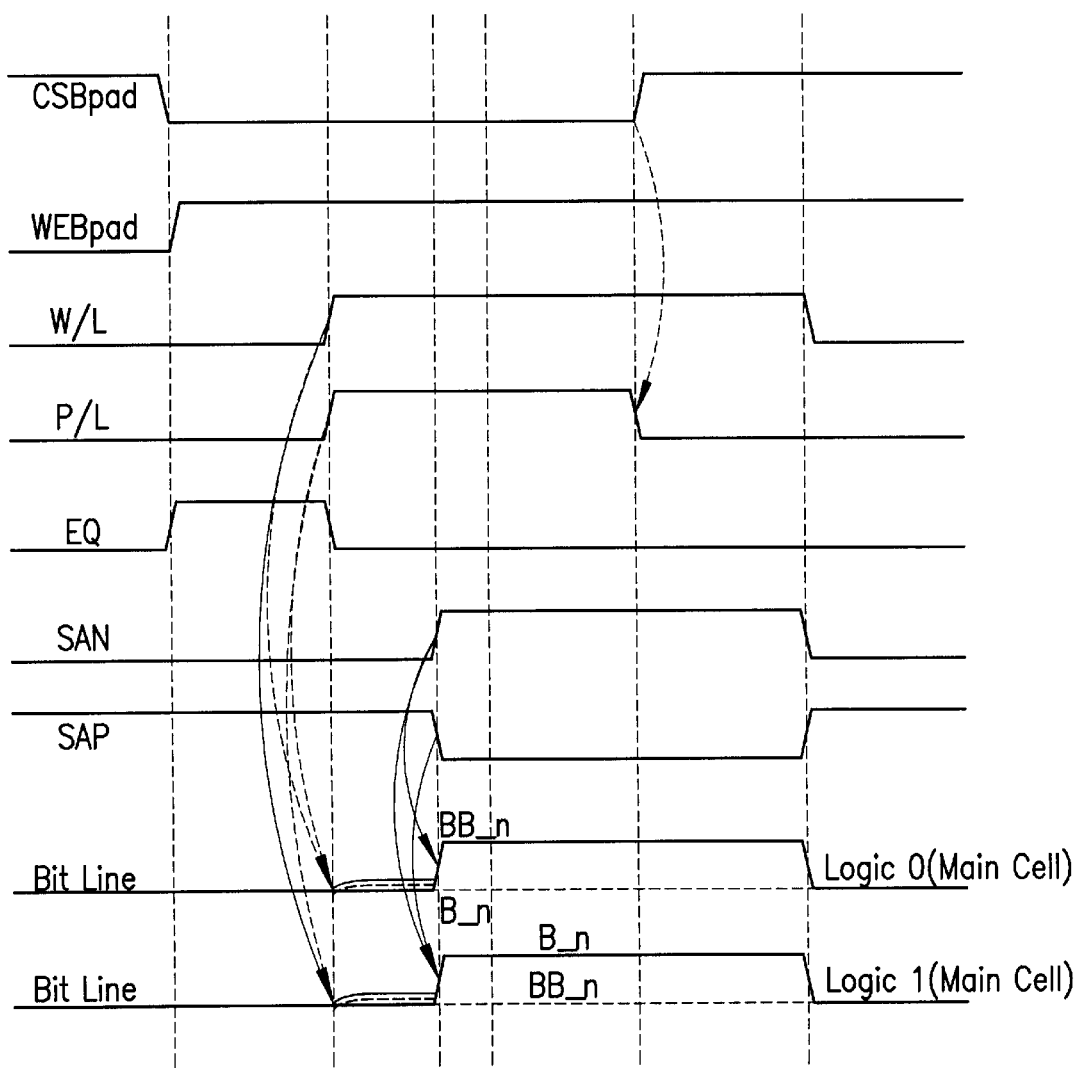
FIG. 3b is a timing chart illustrating the operation of a read mode of the related art nonvolatile ferroelectric memory device.
Figure 4:
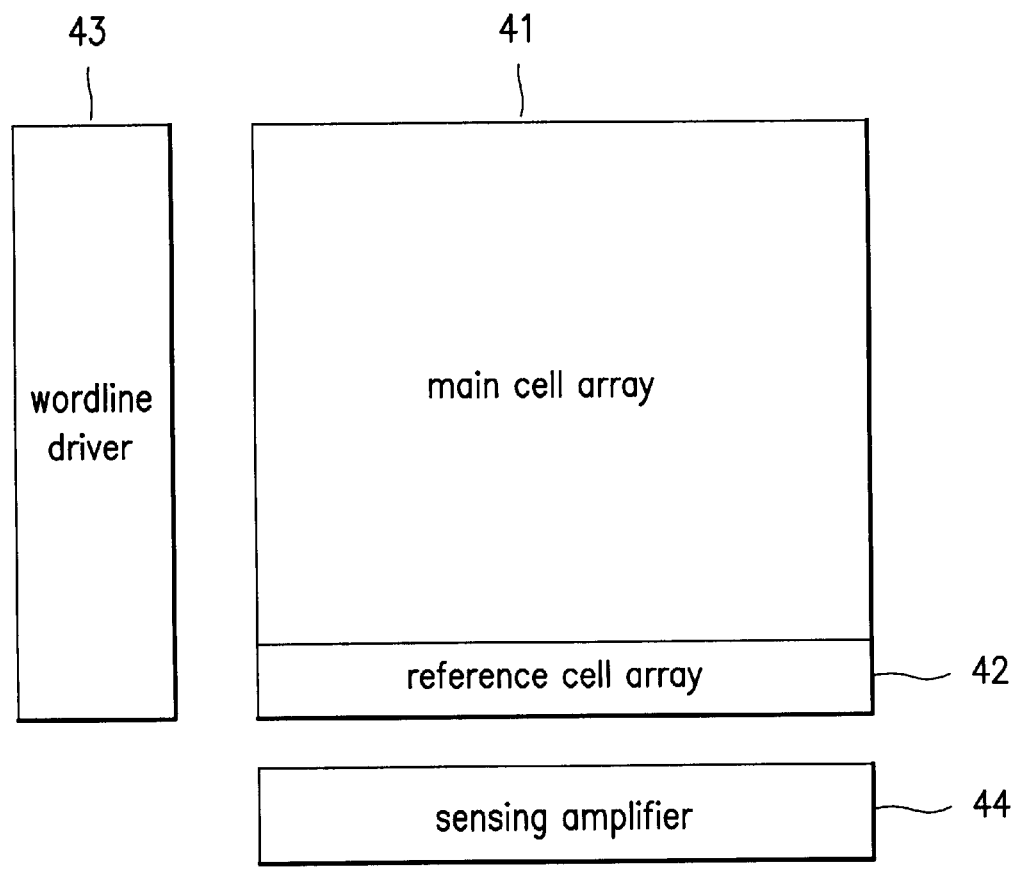
FIG. 4 is a block diagram of the related art nonvolatile ferroelectric memory device.
Figure 5:
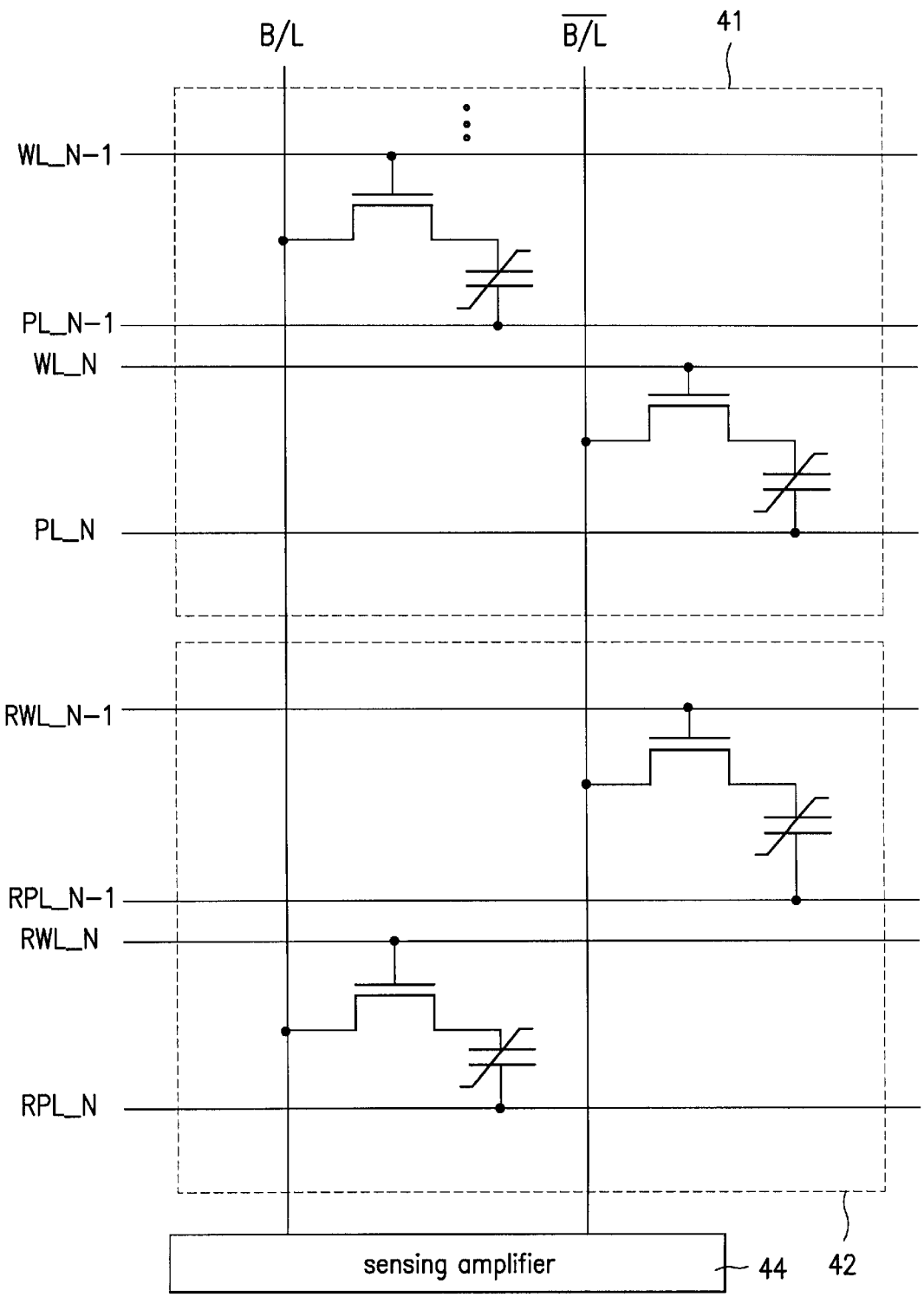
FIG. 5 is a partially detailed view of FIG. 4.
Figure 6:
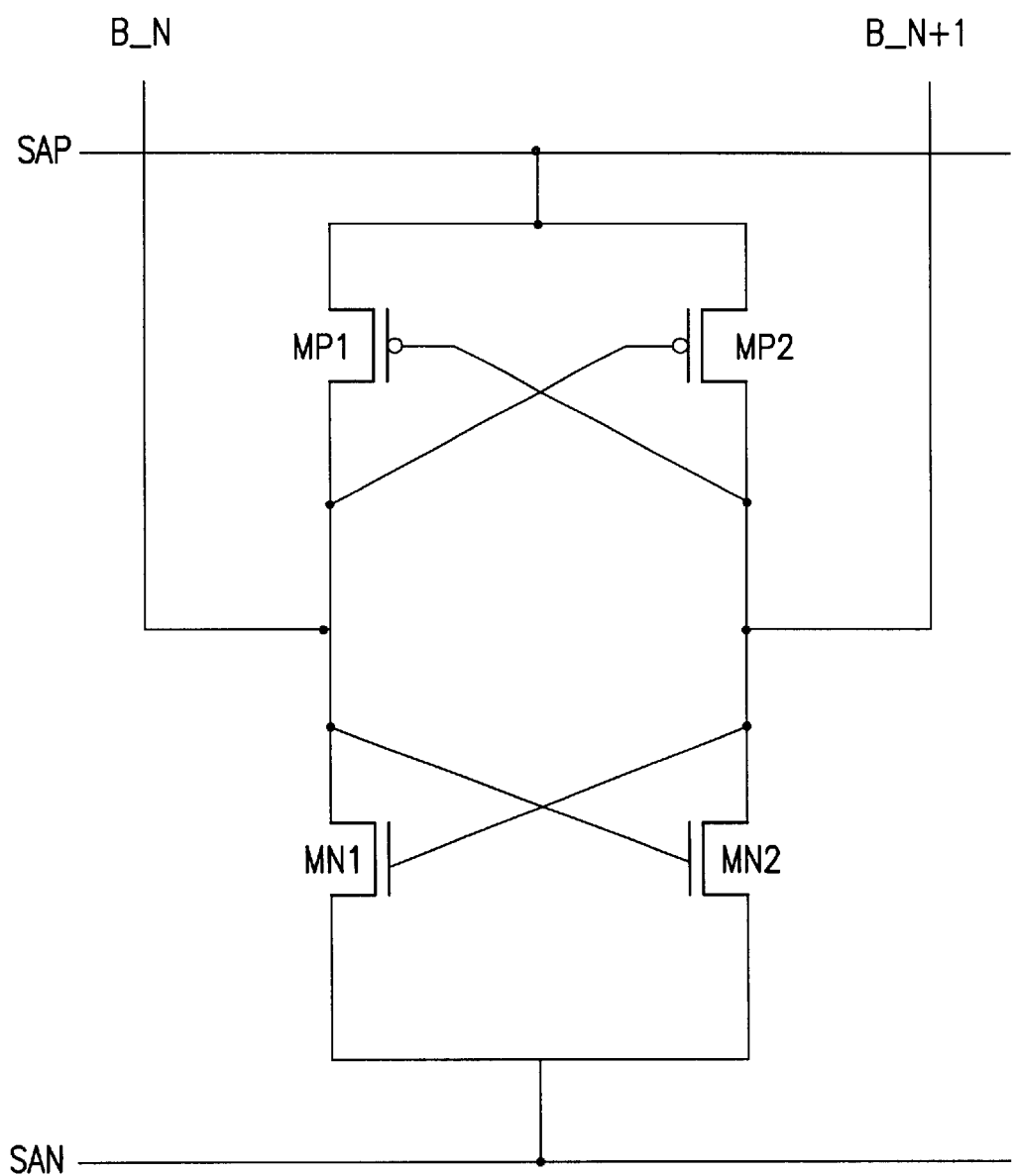
FIG. 6 is a schematic view of a sensing amplifier according to the related art nonvolatile ferroelectric memory.
Figure 7:
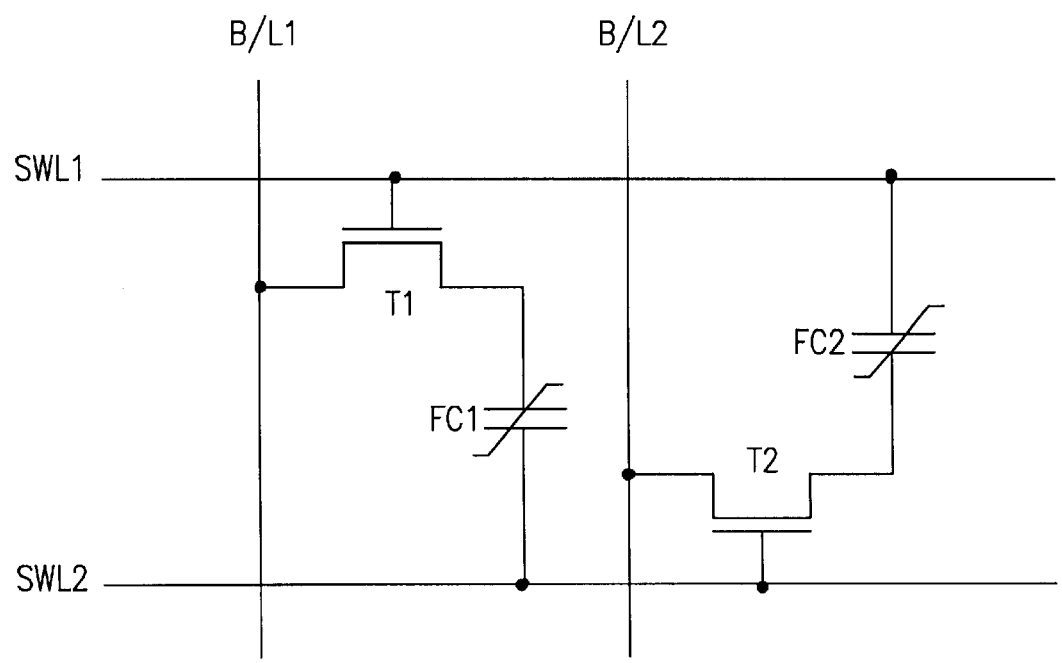
FIG. 7 is a block diagram showing a unit cell of a nonvolatile ferroelectric memory device according to preferred embodiments of the present invention.

FIG. 7 is a schematic view showing a unit cell of a nonvolatile ferroelectric memory device according to preferred embodiments of the present invention. As shown in FIG. 7, a unit cell of the nonvolatile ferroelectric memory device includes first and second split wordlines SWL1 and SWL2 formed with a prescribed interval in a row direction, and first and second bitlines B/L1 and B/L2 formed across the first and second split wordlines SWL1 and SWL2. A first transistor T1 has a gate coupled with the first split wordline SWL1 and drain coupled with the first bitline B/L1. A first ferroelectric capacitor FC1 is coupled between a source of the first transistor T1 and the second split wordline SWL2. A second transistor T2 has a gate coupled with the second split wordline SWL2 and drain coupled with the second bitline B/L2, and a second ferroelectric capacitor FC2 is coupled between a source of the second transistor T2 and the first split wordline SWL1. A plurality of the unit cells constitute a cell array.

In view of data storage, the unit cell can include a pair of split wordlines, a bitline, a transistor 1T, and a ferroelectric capacitor 1C. In view of data structure, the unit cell has a 2T/2C structure that can include a pair of split wordlines, two bitlines, two transistors 2T, and two ferroelectric capacitors 2C.

Figure 8:
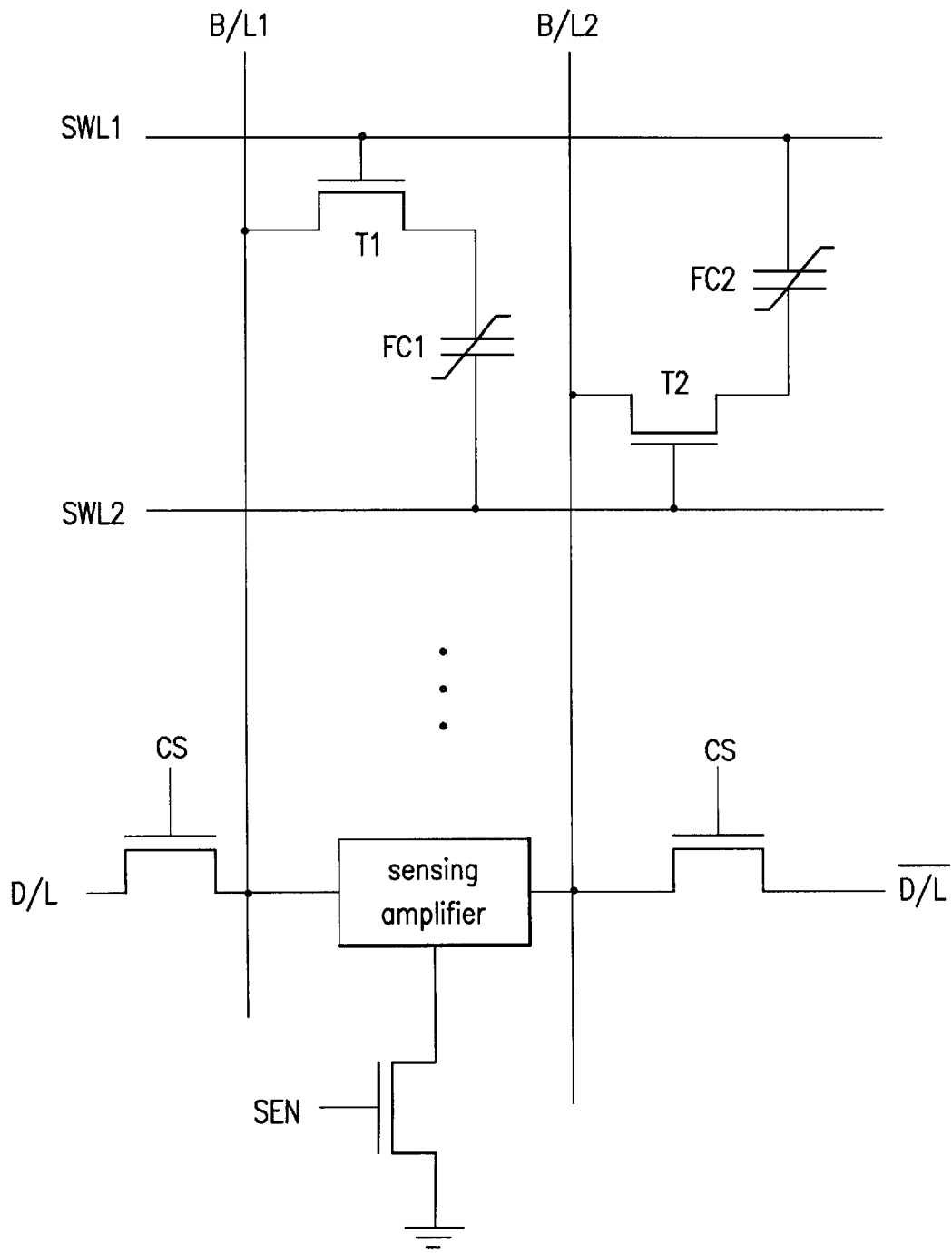
FIG. 8 is a circuit diagram showing a nonvolatile ferroelectric memory device according to the preferred embodiments of present invention.

Operations of a nonvolatile ferroelectric memory device with such unit cells will now be described. FIG. 8 is a circuit diagram showing a nonvolatile ferroelectric memory device according to preferred embodiments of the present invention.

As shown in FIG. 8, a plurality of split wordline pairs including first and second split wordlines SWL1 and SWL2 in pairs are preferably formed in row direction. A plurality of bitlines B/Ln and B/Ln+1 (e.g., B/L1, B/L2) are formed across the split wordline pairs. Sensing amplifiers are formed between the respective bitlines to sense data transmitted through the bitlines and transfer the sensed data to a data line DL or a data bar line /DL. At this time, a sensing amplifier enable portion and a selection switching portion are provided (not shown). The sensing amplifier enable portion outputs a sensing amplifier enable signal SEN to enable the sensing amplifiers SA, and the selection switching portion selectively switches bitlines and data lines and can use a column selection signal CS.

Operations of a nonvolatile ferroelectric memory device according to preferred embodiments of the present invention will be described with reference to a timing chart shown in FIG. 9.

Figure 9:
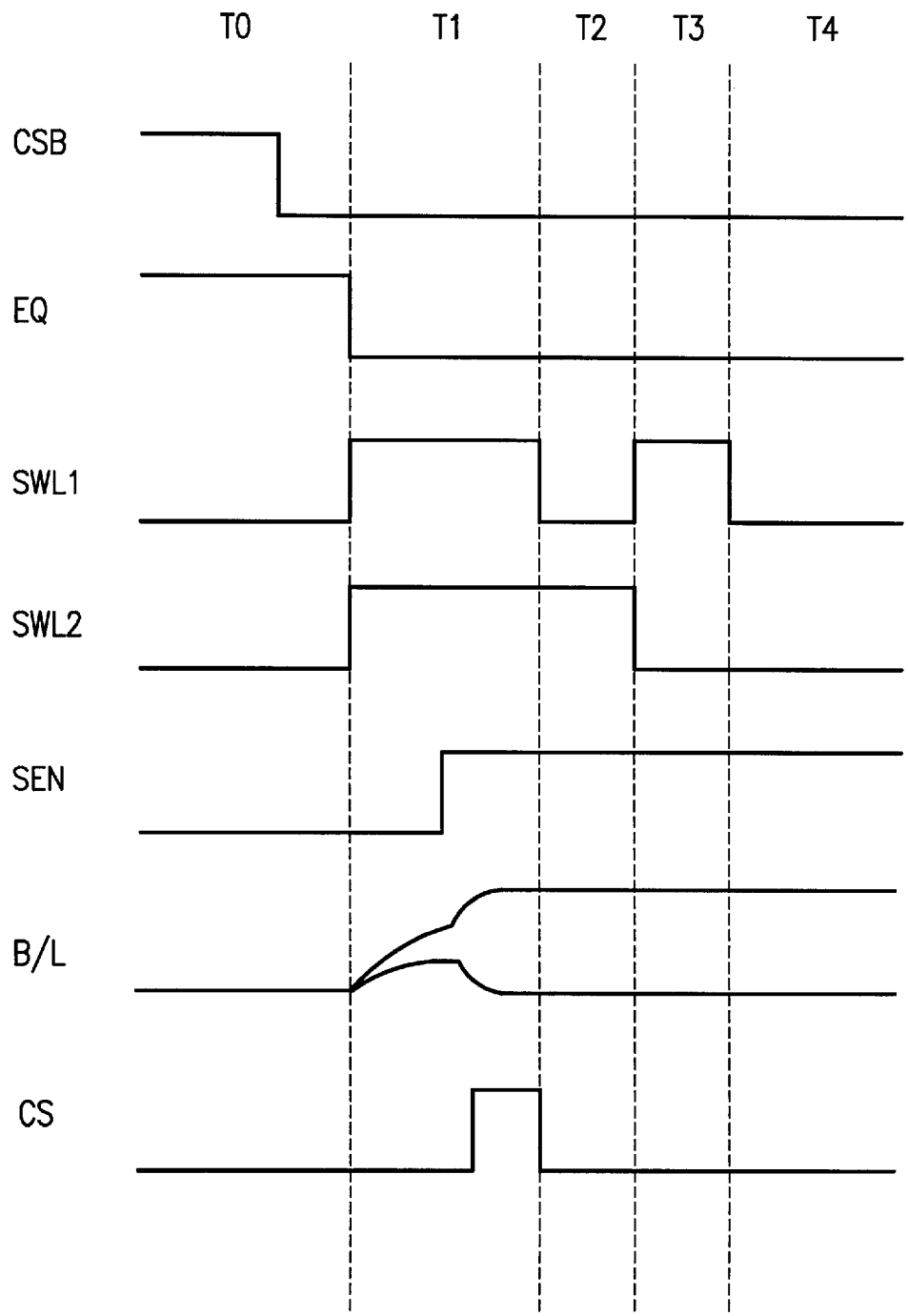
FIG. 9 is a timing diagram showing operations of a nonvolatile ferroelectric memory device in accordance with preferred embodiments of the present invention.

A T0 period in FIG. 9 denotes a period before the first split wordline SWL1 and the second split wordline SWL2 are activated to "high(H)". In this T0 period, all of bitlines are preferably precharged at a threshold voltage level of an NMOS transistor.

A T1 period denotes a period that the first and second split wordlines SWL1 and SWL2 are all to become "H". In this T1 period, data of the ferroelectric capacitor in the main cell are transmitted to the main bitline so that the bitline level is varied.

At this time, in case of the ferroelectric capacitor having a logic value "high", since electric fields having opposite polarities are applied to the bitline and the split wordline, the polarity of the ferroelectric is destroyed so that a large amount of current flows. Thus, a high voltage in the bitline is induced. By contrast, in case of the ferroelectric capacitor having a logic value "low", since electric fields having the same polarities are applied to the bitline and the split wordline, polarity of the ferroelectric is not destroyed so that a small amount of current flows. Thus, a low voltage is induced in the bitline.

If the cell data are loaded in the bitline sufficiently, the sensing amplifier enable signal SEN is transited to high so as to activate the sensing amplifier. As a result, the bitline level is amplified.

Since the logic data "H" of the destroyed cell can not be restored at the state that the first and second split wordlines SWL1 and SWL2 are high, the data can be restored in T2 and T3 periods. Subsequently, in T2 period, the first split wordline SWL1 is transited to low, the second split wordline SWL2 is maintained at high level, and the second transistor T2 is turned on. At this time, if the corresponding bitline is high, high data is transmitted to one electrode of the second ferroelectric capacitor FC2 so that the logic value "1" is restored.

In the T3 period, the first split wordline SWL1 is transited to high, the second split wordline SWL2 is transited to low, and the first transistor T1 is turned on. At this time, if the corresponding bitline is high, high data is transmitted to one electrode of the first ferroelectric capacitor FC1 so that logic value "1" is restored.

Figure 10:
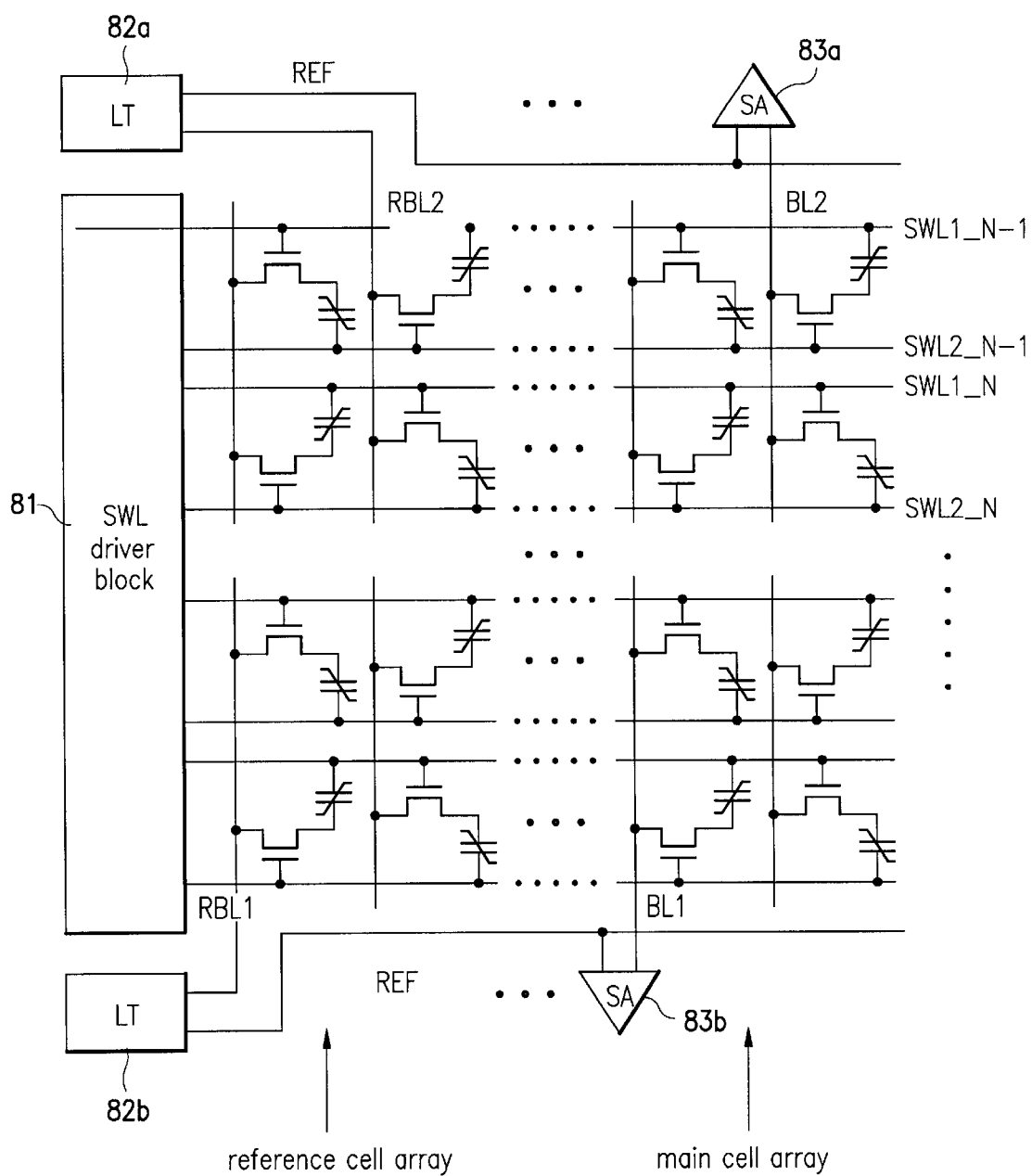
FIG. 10 is a circuit diagram of a nonvolatile ferroelectric memory device having a reference cell area according to preferred embodiments of the present invention.

FIG. 10 is a diagram that illustrates a circuit of 1T1C ferroelectric memory inclusive of reference cells according to preferred embodiments. An array of 1T1C ferroelectric memory according to the preferred embodiments may be divided into a reference cell region and a main cell region. The array of the main cell region has a split wordline structure with reference cells RC in a reference cell area in a column portion in one side of the main cell array. If it is assumed that the two split wordlines in the array are SWL1_N−1, SWL2_N−1 and SWL1_N, SWL2_N, when one pair of split wordlines are enabled by a SWL driver block 81, the cells in the main cell region and the reference cell region are enabled. The data in the main cell is transferred to main bitlines BL1, BL2, and therefrom to sense amplifier 83a and 83b, and the data in the reference cell is transferred to reference bitlines RBL1, RBL2.

As shown in FIG. 10, a reference bitline signal is used, not directly, but provided to the sense amplifier after the reference bitline signal is amplified through a level shift tracer (LT) 82a and 82b. In this instance, the reference bitline signal is preferably equal to a logic zero of the main bitline because sizes of the main cell and the reference cell are made the same, and the reference cell is adapted to store a logic zero. Therefore, the level shift tracer detects a level of the reference bitline and provides an output having a $\Delta V$ added to the reference bitline level. The output level is between a level high and a level low on the main bitline caused by the main cell. As the reference cell receives a signal from the split wordline, the foregoing 1T1C ferroelectric memory is stable, and degradation of the cell is suppressed.

When the ferroelectric memory has the system as shown in FIG. 8, since the sense amplifier array provided in correspondence to the cell array block having cells controlled by one SWL driver block, there is a limit in providing faster data input/output operation of the device because of bitline loading and difficulty in reducing a layout area for an entire chip array. The bitline loading and the layout area causes difficulty in an efficient disposal of cell arrays and sense amplifier arrays that requires much time from memory design to mass production, which reduces competitiveness of a corresponding product. Preferred embodiments according to the present invention disclose a novel cell array structure in which an influence from the bitline loading can be reduced in a data sensing operation, and a layout of the sense amplifier array can reduce bitline size and reduce design and production time.

Figure 11:
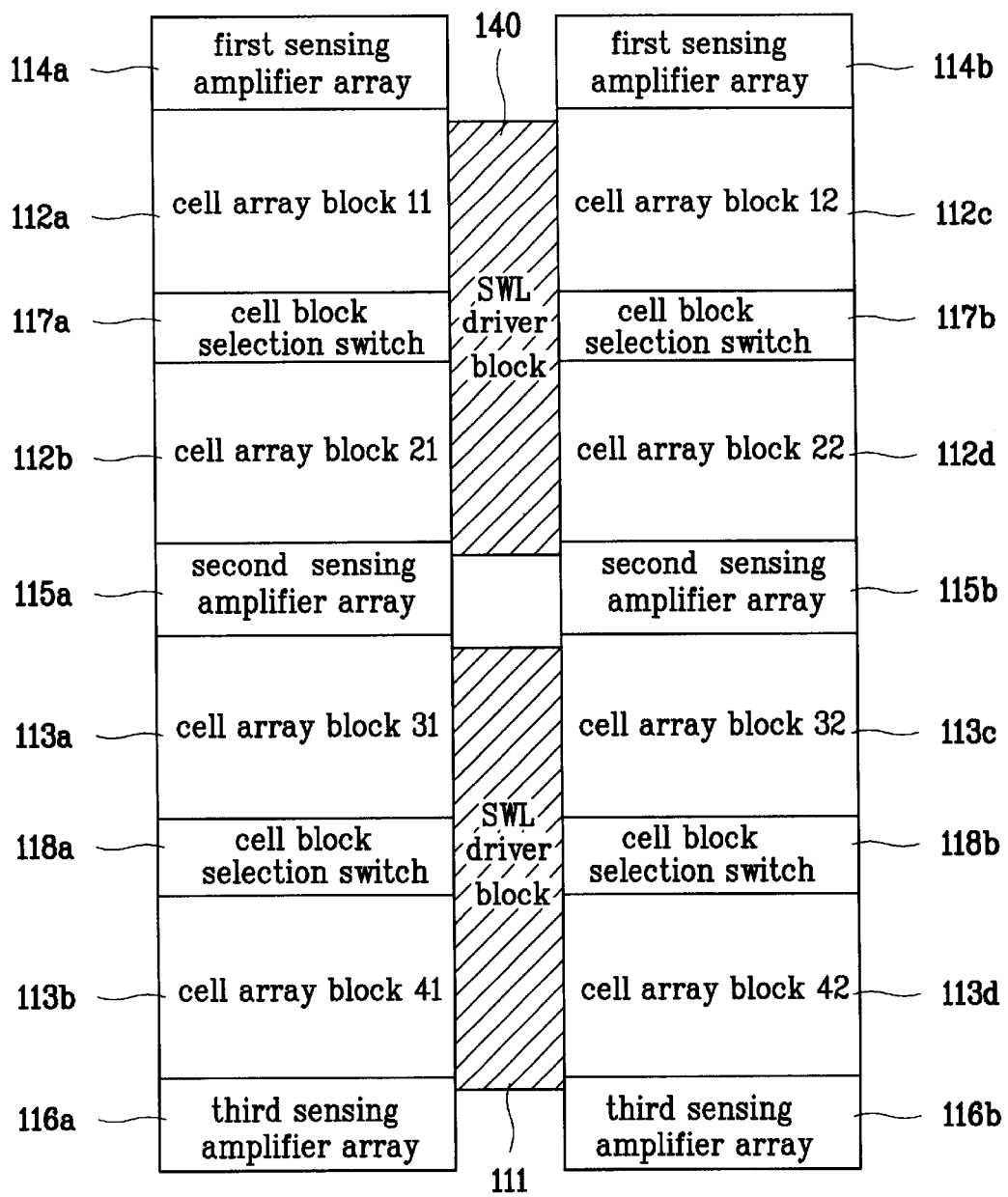
FIG. 11 is a block diagram of a cell array block according to preferred embodiments of the present invention.

FIG. 11 is a diagram that illustrates a layout of a memory device having cell array blocks according to preferred embodiments of the present invention when cell arrays are controlled by two split word line driver blocks. FIG. 11 illustrates a cell array with a high speed data operation and a reduced layout for sense amplifier arrays. As shown in FIG. 11, one cell array block controlled by one split word line (SWL) driver block 110 is divided into two, which are preferably an upper and a lower cell array blocks. Another cell array block controlled by another SWL driver block 111 is preferably divided into upper and lower cell array blocks. Switching devices that are for cell selection in data sensing operations are provided between the two divided cell array blocks for reducing bitline loading during operations such as sensing operations. Cells on bitlines coupled to switching devices on an odd numbered column or even numbered column in the lower cell array blocks 112b and 112d controlled by the SWL driver block 110 and the upper cell array block 113a and 113c controlled by the SWL driver block 111 share the second sense amplifier arrays 115a and 115b. Sharing sense amplifier arrays facilitates a reduced size and simplifies overall layout that can decrease design requirements.

As shown in FIG. 11, a system preferably includes a cell array block11 112a, a cell array block21 112b, a cell array block12 112c, and a cell array block22 112d, which are divided from cell array blocks controlled by the SWL driver block 110, and cell block selection switching units 117a and 117b provided between the array block11 112a and the cell array block21 112b, and between the array block12 112c and the cell array block22 112d. The system can also include a cell array block31 113a, a cell array block41 113b, a cell array block32 113c, and a cell array block42 113d, which are divided from cell array blocks controlled by the SWL driver block 111. Cell block selection switching units 118a and 118b are provided between the array block31 113a and the cell array block41 113b, and between the array block32 113c and the cell array block42 113d. Output lines on respective switching devices in the cell block selection switching units 117a, 117b, 118a, and 118b are preferably coupled to the upper sense amplifier arrays and the lower sense amplifier arrays, alternatively. Therefore, data input/output to/from cells coupled to one of the bitlines either on the odd numbered column or even numbered column are made through the upper sense amplifier array and the other one are made through the lower sense amplifier array. However, the present invention is not intended to be so limited, other divisions of bitlines can be used. Further, the cell array blocks controlled by different SWL driver blocks preferably share the sense amplifier array provided between the cell array blocks. As shown in FIG. 11, the second sense amplifier arrays 115a and 115b provided between the lower cell array blocks21 and 22 112b and 112d controlled by the SWL driver block 110 and the upper cell array blocks31 and 32 113a and 113c controlled by the SWL driver block 111 are exemplary shared blocks. And, there are first sense amplifier arrays 114a and 114b and third sense amplifier arrays 116a and 116b over the cell array blocks 11 and 12 112a and 112c and under the cell array blocks41 and 42 113b and 113d, respectively, preferably shared with the cell array blocks controlled by different SWL driver blocks. Additional address decoding, wordline driving and output circuit (not shown) are coupled to the memory device.

Figure 12:
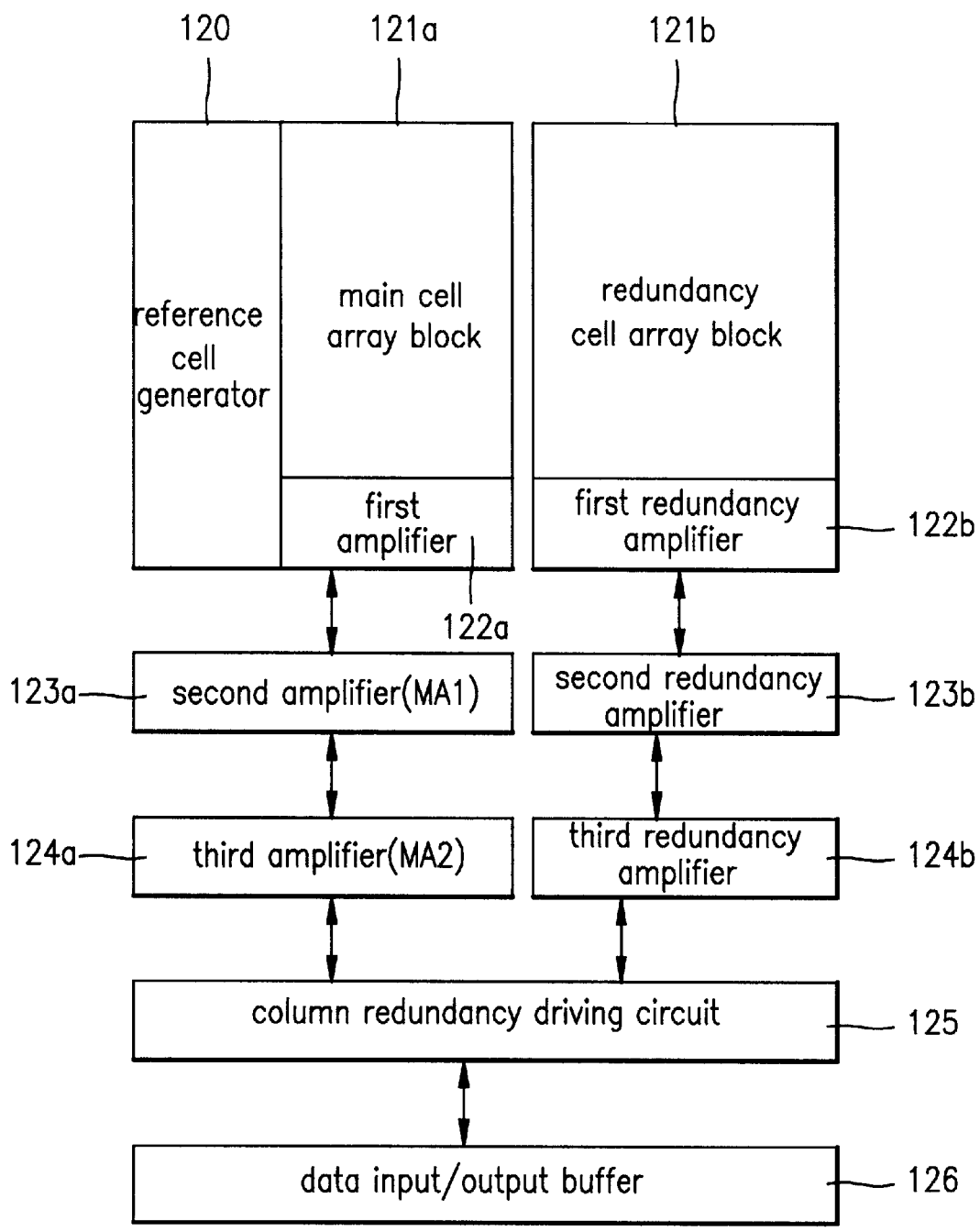
FIG. 12 is a preferred embodiment of a nonvolatile ferroelectric memory device with a column redundancy circuit according to the present invention.
Figure 13:
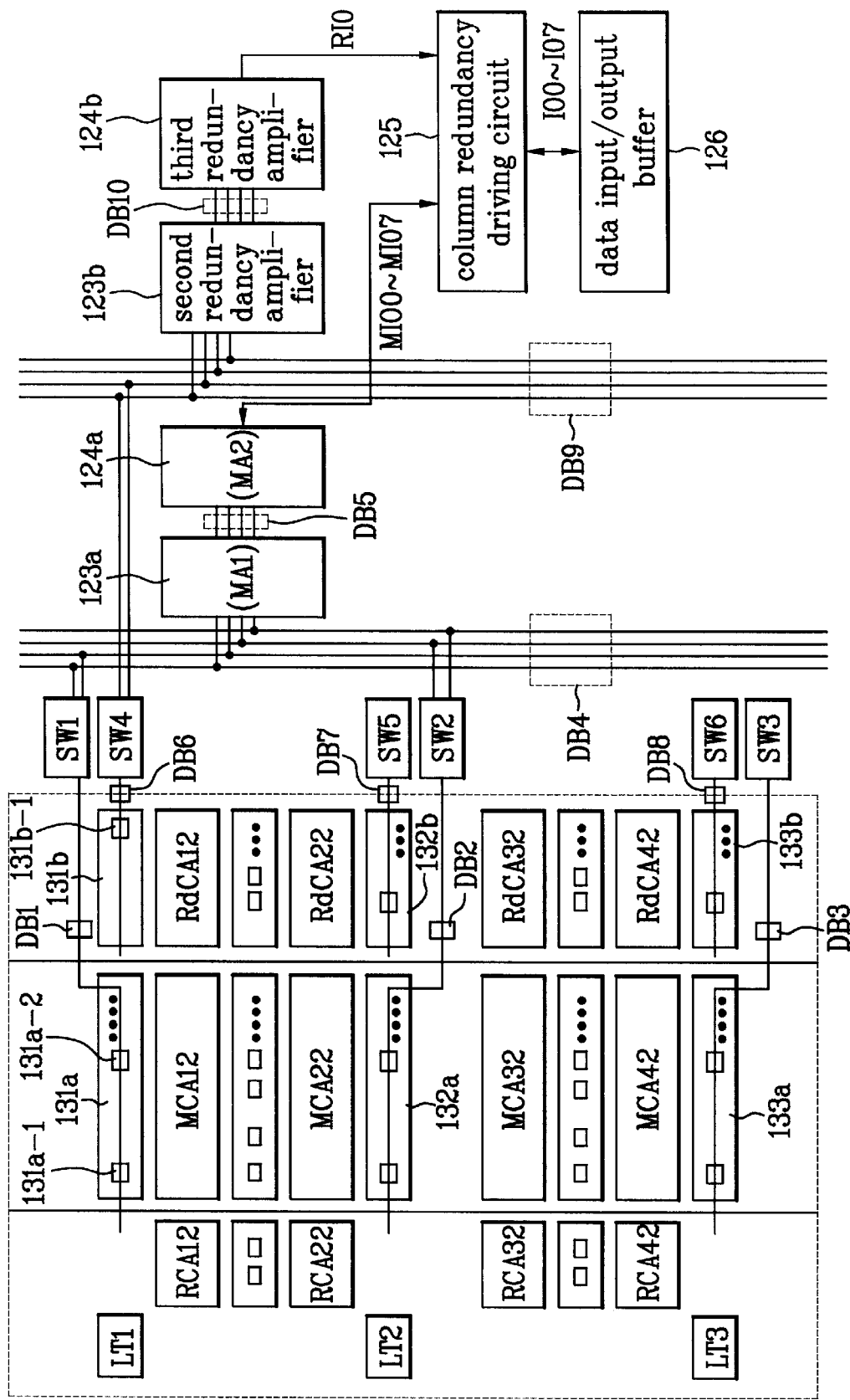
FIG. 13 is a partial schematic detailed block diagram of FIG. 12.
Figure 14:
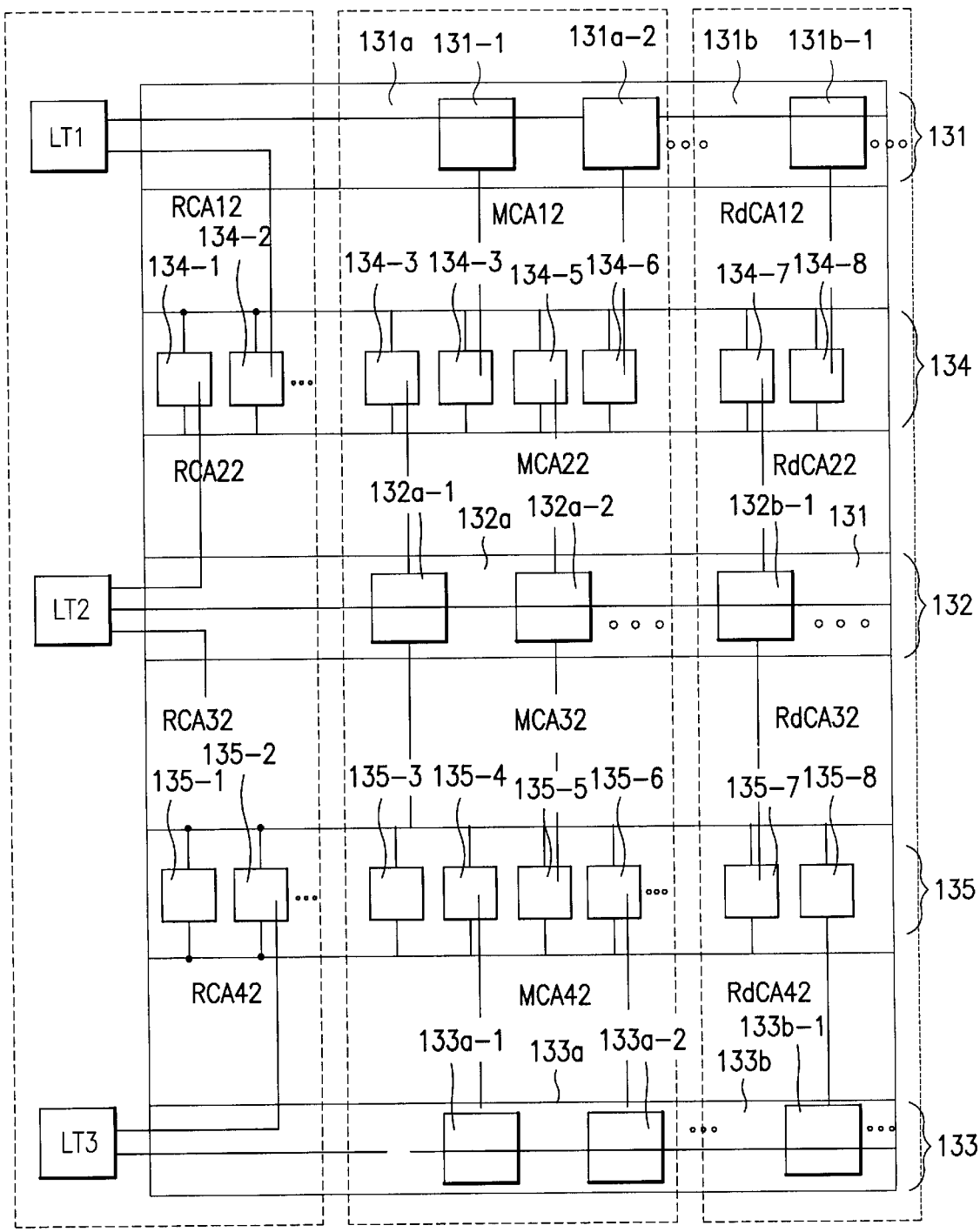
FIG. 14 is a block diagram showing a reference cell area and a main cell area of FIG. 13.

In nonvolatile ferroelectric memory device according to the preferred embodiments, if a column address fails when selecting an address, a circuit for relieving the failed column address is required. FIG. 12 is a block diagram that shows a first preferred embodiment of a column redundancy circuit of a nonvolatile ferroelectric memory device according to the present invention. FIG. 13 is a partial circuit diagram of FIG. 12, and FIG. 14 is a block diagram showing a reference cell area and a main cell area of FIG. 13.

As shown in FIG. 12, the first preferred embodiment of the nonvolatile ferroelectric memory device with a column redundancy circuit includes a reference level generator 120, a column block circuit related to a main cell area, a column block circuit related to a redundancy cell area, a column redundancy driving circuit 125, and a data input/output buffer 126. The column block circuit related to the main cell area includes a main cell array block 121a, a first amplifier 122a, a second amplifier MA1 123a, a third amplifier MA2 124a. The column block circuit related to the redundancy cell area includes a redundancy cell array block 121b, a first redundancy amplifier 122b, a second redundancy amplifier (redundancy MA1) 123b, and a third redundancy amplifier (redundancy MA2) 124b.

The reference level generator 120 operates to form a column reference level when sensing a cell area. The column redundancy driving circuit 125 operates to relieve a failed column by substituting the failed column of a corresponding main cell for a redundancy column if a column address of the main cell fails. The data input/output buffer 126 operates to transmit the relieved column data to an input/output pad.

There is preferably three stage amplification or amplifiers in the column block circuit related to the main cell and the column block circuit related to the redundancy cell, respectively. However, the present invention is not intended to be so limited. A first amplifier is a bitline sensing amplifier for primarily amplifying data of the cell. There are a first amplifier 122a and a first redundancy amplifier 122b in the first amplifier. The second amplifier amplifies data output through an output bus of the first amplifier 122a and the first redundancy amplifier 123b. There are a second amplifier 123a and a second redundancy amplifier 123b in the second amplifier 123a and the second redundancy output through an output bus of the second amplifier 123a and the second redundancy amplifier 123b. There are a third amplifier 124a and a third redundancy amplifier 124b in the third amplifier.

Reading and writing operations in the main cell area and the redundancy cell area according to preferred embodiments of the present invention are performed through three-stage data paths without using separate data paths. Reading and writing operations in the main cell through the first, second and third amplifiers according to the first preferred embodiment will now be described.

In a read mode, data of the main cell are primarily amplified by the first amplifier 122a. Output signals amplified by the first amplifier 122a are input through a common output bus (e.g., commonly used for reading and writing operation) and then amplified by the second amplifier 123a. Output signals amplified by the second amplifier 123a are input to the third amplifier 124a through a common output bus of the second amplifier 123a. The third amplifier 124a performs the final amplification. The amplified data from the third amplifier 124a is transmitted to the input/output pad through an output buffer.

In a write mode, data of the cell coupled with the cell arrays are read out regardless of read/write modes. That is to say, data of the main cell are primarily amplified by the first amplifier 122a. Data for writing are transmitted from the data input buffer to the second amplifier 123a and then sequentially amplified through the second amplifier 123a and the third amplifier 124a. The data of the sensing amplifiers are transmitted to the bitlines as a gate of the column selection transistor of the sensing amplifier, so that new data are written in the main cell. Reading and writing operation using the aforementioned sensing amplifiers can be performed using the same data bus, that is, one read/write bus without using separate read and write buses. As described above, the nonvolatile ferroelectric memory device with a column redundancy circuit shown in FIG. 12 has hierarchical structural amplifiers.

As shown in FIGS. 13 and 14, there are reference cell arrays RCA12, RCA22, RCA32 and RCA42 driven by the different split wordline driver blocks in the reference cell array blocks. There are main cell arrays MCA12, MCA22, MCA32 and MCA42 driven by the different split wordline driver blocks in the main cell array blocks. There are a plurality of cell array blocks RdCA12, RdCA22, RdCA32, and RdCA42 in the redundancy cell array blocks. The cell array blocks RdCA12, RdCA22, RdCA32, and RdCA42 are respectively controlled by the different split wordline driver blocks.

There are first and second cell block selection switches 134 and 135 between the cell array blocks controlled by the same split wordline drivers. There are cell block selection switches 134-1 and 134-2 between the reference cell arrays RCA12 and RCA22, and there are cell block selection switches 135-1 and 135-2 between the reference cell arrays RCA32 and RCA42. There are cell block selection switches 134-3, 134-4, 134-5 and 134-6 shown between the main cell arrays MCA12 and MCA22, and there are cell block selection switches 135-3, 135-4, 135-5 and 135-6 shown between the main cell arrays MCA32 and MCA42. Also, there are cell block selection switches 134-7 and 134-8 shown between the redundancy cell array blocks RdCA12 and RdCA22, and there are cell block selection switches 135-7 and 135-8 shown between the redundancy cell array blocks RdCA32 and RddCA42.

1-1st, 2-1st, 3-1st sensing amplifiers 131*a*, 132*a* and 133*a* of the main cell array block preferably are included in the first sensing amplifier 122*a*, and 1-2nd, 2-2nd and 3-2nd sensing amplifiers 131*b*, 132*b* and 133*b* of the redundancy cell array block preferably are included in the first redundancy amplifier 122*b*. The 1-1st and 1-2nd sensing amplifiers 131*a* and 131*b* constitute the first sensing amplifier array 131, the 2-1st and 2-2nd sensing amplifiers 132*a* and 132*b* constitute the second sensing amplifier array 132, and the 3-1st and 3-2nd sensing amplifiers 133*a* and 133*b* constitute the third sensing amplifier array 133.

The 1-1st sensing amplifier 131*a* of the main cell array block includes sensing amplifiers 131*a*-1 and 131*a*-2, the 2-1st sensing amplifier includes sensing amplifiers 132*a*-1 and 132*a*-2, and the 3-1st sensing amplifier 133*a* includes sensing amplifiers 133*a*-1 and 133*a*-2.

The 2-1st sensing amplifier 131*b* of the redundancy cell array block includes a sensing amplifier 131*b*-1, the 2-2nd sensing amplifier 132*b* includes a sensing amplifier 132*b*-1, and the 3-2nd sensing amplifier 133*b* includes a sensing amplifier 133*b*-1.

The sensing amplifiers 132*a*-1, 132*a*-2 and 132*b*-1 of the second sensing amplifier array 132 are arranged between the respective cell array blocks of the main cell array block and the redundancy cell array block that are driven by the different split wordline drivers are commonly coupled with the cell block selection switches 134-3, 134-5 and 134-7 and are preferably coupled to the bitlines of the odd numbered columns of the cell array blocks MCA22 and RdCA22. The cell block selection switches135-3, 135-5, and 135-7 are coupled to the bitlines of the odd numbered columns of the cell array blocks MCA32 and RdCA32. Preferably, in a similar fashion, the cell block selection switches coupled to the bitlines of the even numbered columns of the cell array blocks MCA22 and RdCA-22 are commonly coupled with the cell block selection switches 135-4,135-6, and 135-8 coupled to the bitlines of the even numbered columns of the cell array blocks MCA32 and RdCa32 driven by different split wordline drivers (not shown), and commonly use the respective sensing amplifiers. The respective cell block selection switches are coupled to the bitlines of the cell array blocks and select the upper cell blocks or the lower cell blocks.

The output signals of the respective cell block selection switches of the main cell array block and the redundancy cell array block are input to the respective sensing amplifiers of the upper and lower sensing amplifier arrays. As shown in FIG. 13, and 14, the even numbed columns are coupled to the upper sensing amplifiers while the odd numbered columns are coupled to the lower sensing amplifiers.

Reference cell array blocks will now be described. As shown in FIGS. 13 and 14, in the column reference cell, bitline signals of the reference cell arrays RCA12 and RCA22 are respectively input to the cell block selection switches 134-1 and 134-2, and output signals of the cell block selection arrays RCA12 and RCA22 are respectively input to level shift tracers LT1 and LT2 arranged at upper and lower parts of the reference cell arrays RCA12 and RCA22. An output terminal of the cell block selection switch 134-2 in an even numbered column is preferably coupled to an input terminal of the level shift tracer LT1, and an output terminal of the cell block selection switch 134-1 in an odd numbered column is preferably coupled to an input terminal of the level shift tracer LT2.

Bitline signals of the reference cell arrays RCA32 and RCA42 are respectively input to the cell block selection switches 135-1 and 135-2, and output signals of the cell block selection switches 135-1 and 135-2 are respectively input to level shift tracers LT2 and LT3 arranged at upper and lower parts of the reference cell arrays RCA32 and RCA42. An output terminal of the cell block selection switch 135-2 in an even-numbered column is preferably coupled to the input terminal to the level shift tracer LT2, and an output terminal of the cell block selection switch 135-1 in an odd-numbered column is preferably coupled to the input terminal to the level shift tracer LT2. In the above described reference cell array blocks, the number of sensing amplifier arrays and level shift tracers can be reduced.

A bitline coupled with the upper cell block of the cell block selection switch is referred to as a top bitline, and a bitline coupled with the lower cell block of the cell block selection switch is referred to as a bottom bitline. Preferably, the top and bottom bitlines are formed on the same layer.

A sensing amplifier input line of the cell block selection switches, which is coupled with the upper sensing amplifier, is referred to as a top sensing line, and a sensing amplifier input line of the cell block selection switches, which is coupled with the lower sensing amplifier, is referred to as a bottom sensing line. Preferably, the top and bottom sensing lines are formed on different layers.

A sensing amplifier structure for sensing and amplifying data of the main cell area will now be described. As shown in FIG. 13, the sensing amplifier structure includes first, second and third data buses DB1, DB2 and DB3 commonly used for sensing amplifiers arranged on the same line in row direction in first, second and third sensing amplifier arrays formed at upper and lower parts of the MCA12 and MCA22 and upper and lower parts of the MCA32 and MCA42, respectively, for interfacing output signals of the sensing amplifiers. First, second and third switches SW1, SW2 and SW3 are coupled to output terminals of the first, second and third data buses DB1, DB2 and DB3 respectively. A fourth data bus DB4 is for interfacing signals transmitted through the first, second and third data buses DB1, DB2 and DB3. A second amplifier 123a is for sensing and amplifying a signal transmitted through the fourth data bus DB4, and a fifth data bus DB5 is for interfacing an output signal of the second amplifier 123a. A third amplifier 124a is for sensing and amplifying the signal transmitted through the fifth data bus DB5.

The first and third switches SW1 and SW3 are differently switched. Accordingly, the fourth data bus DB4 includes four data lines.

A structure according to the first preferred embodiment for sensing data by substituting the failed column address for a column address of the redundancy cell array block when a column address fails while sensing and amplifying data from the main cell array block will now be described. As shown in FIG. 13, the data sensing structure includes sixth, seventh and eighth data buses DB6, DB7 and DB8 to which output signals of sensing amplifiers 131b-1, 132b-1 and 133b-1 in first, second and third sensing amplifier arrays formed at upper and lower parts of the RdCA12 and RdCA22 and upper and lower parts of the RdCA32 and RdCA42 are respectively transmitted. Fourth, fifth and sixth switches SW4, SW5 and SW6 are coupled to output terminals of the sixth, seventh and eighth data buses DB6, DB7 and DB8 respectively, and a ninth data bus DB9 is for interfacing signals transmitted through the sixth, seventh and eighth data buses DB6, DB7 and DB8. A second redundancy amplifier 123b is for sensing and amplifying the signal transmitted through the ninth data bus DB9, and a tenth data bus DB10 is for interfacing an output signal of the second redundancy amplifier 123b, and a third redundancy amplifier 124b for sensing and amplifying the signal transmitted through the tenth data bus DB10.

The fourth and sixth switches SW4 and SW6 are differently switched. Accordingly, the ninth data bus DB9 includes four data lines.

The data sensing structure further includes the column redundancy driving circuit 125 for substituting a failed column of a corresponding main cell for a relief column when a column address of the main cell array block fails, and a data input/output buffer 126 for transmitting the relieved column data to an input/output pad.

Figure 15:
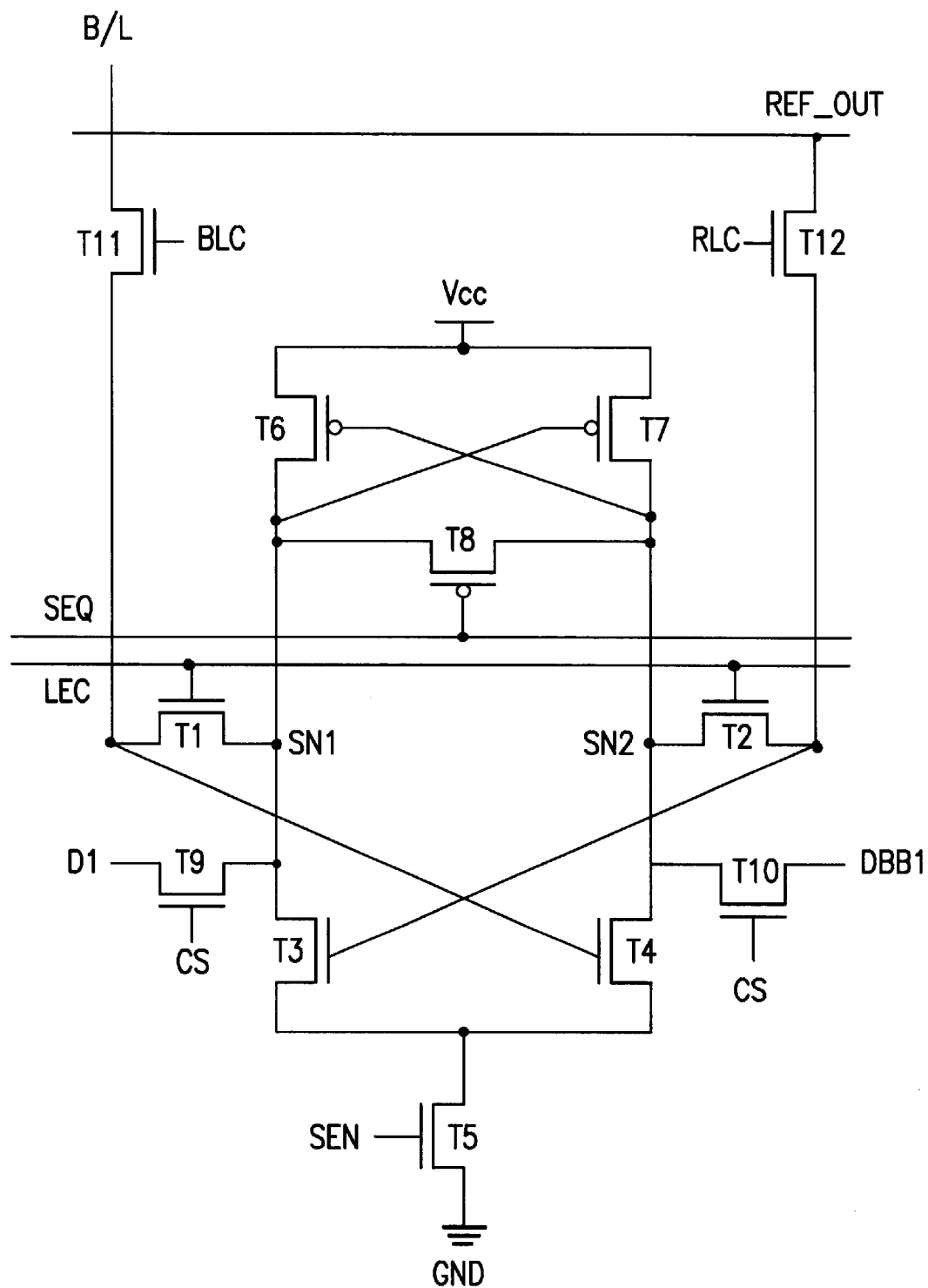
FIG. 15 is a diagram showing a preferred embodiment of a first amplifier of main and redundancy cell areas according to the present invention.

A preferred embodiment of a first amplification state being a first amplifier and the first redundancy amplifier will now be described. As shown in FIG. 15, the first amplifier and the first redundancy amplifier include a first transistor T1 for switching a signal of the main bitline that is applied to its source, a second transistor T2 for switching a reference signal applied to its source, a third transistor T3 whose gate is coupled with the source of the second transistor T2 and drain whose coupled is with a drain of the first transistor T1. A fourth transistor T4 has a gate coupled with an input terminal of the first transistor T1 and a drain coupled with the drain of the second transistor T2. A fifth transistor T5 has a source coupled with a ground terminal GND and a drain commonly coupled to the third and fourth transistors. A sixth transistor T6 has a gate coupled with the drain of the second transistor T2, a source coupled with a power source voltage terminal Vcc and a drain coupled with the drain of the first transistor T1. A seventh transistor T7 has a gate coupled with the drain of the first transistor T1, a source coupled with the power source voltage terminal, and a drain coupled with the drain of the second transistor T2, and an eighth transistor T8 equalizes the drain of the sixth transistor T6 with the drain of the seventh transistor T7. A ninth transistor T9 has a source coupled with the drain of the third transistor T3, for switching the amplified signal of the main bitline to a data bus D1, and a tenth transistor has a source coupled with the drain of the fourth transistor T4, for switching a reverse phase signal of the amplified signal of the main bitline to a data bar bus DBB1.

Further, an eleventh transistor T11 is for switching the signal of the main bitline to the source of the first transistor T1, and a twelfth transistor T12 is for switching the reference signal to the source of the second transistor T2. The eleventh transistor T1 is controlled by a main bitline control signal BLC while the twelfth transistor T12 is controlled by a reference bitline control signal RLC.

The first transistor T1 further acts to allow the amplified signal feedback to the gate of the fourth transistor T4, and the second transistor T2 further acts to allow the amplified signal feedback to the gate of the third transistor T3. The first and second transistors T1 and T2 are turned on in case of data writing operation but turned off in case of data reading operation.

The ninth and tenth transistors T9 and T10 are controlled by a column selection signal CS.

As shown in FIG. 15, the sixth, seventh and eighth transistors T6, T7 and T8 constitute a PMOS transistors and the remaining transistors constitute an NMOS transistors. The fifth transistor T5 is operated by a sensing amplifier active signal SEN and the eighth transistor T8 is operated by a sensing amplifier equalizing signal SEQ. A latch enable control signal LEC is applied to the gates of the first and second transistors T1 and T2.

Operations of the first amplifier and first redundancy amplifier will now be described. As shown in FIG. 15, during precharge, the main bitline control signal BLC, the reference bitline control signal RLC, and the latch enable control signal LEC become high while the column selection signal CS, the sensing amplifier active signal SEN and the sensing amplifier equalizing signal SEQ become low.

In a read mode, the sensing amplifier equalizing signal SEQ and the sensing amplifier active signal SEN become high while the main bitline control signal BLC, the reference bitline control signal BLC and the latch enable control signal LEC become low. Accordingly, the main bitline signal is amplified and then output to a second amplifier through the data bus D1 and the data bar bus DBB1. At this time, the latch enable control signal LEC preferably is transited to low so that the main bitline is separated from the path of the data bus D1 and the data bar bus DBB1.

Subsequently, in a write mode, the sensing amplifier equalizing signal SEQ, the column selection signal CS, and the latch enable control signal LEC are set up at high level before the sensing amplifier active signal SEN is changed to high level. Accordingly, the data to be written in the cell are input through the data bus D1 and the data bar bus DBB1 to be transmitted to the main bitline.

If the data are transmitted to the main bitline, the sensing amplifier active signal SEN is transited to high level while the other signals are maintained. Accordingly, the first amplifier becomes active to transmit the data for writing to a corresponding cell through the main bitline.

As described above, by properly controlling the control signals applied to the first amplifier and the first redundancy amplifier, it is possible to perform both the reading operation for reading data of the cell to be output through the data bus and the data bar bus and the writing operation for storing the data for writing in the corresponding cell through the main and redundancy bitlines.

Figure 16:
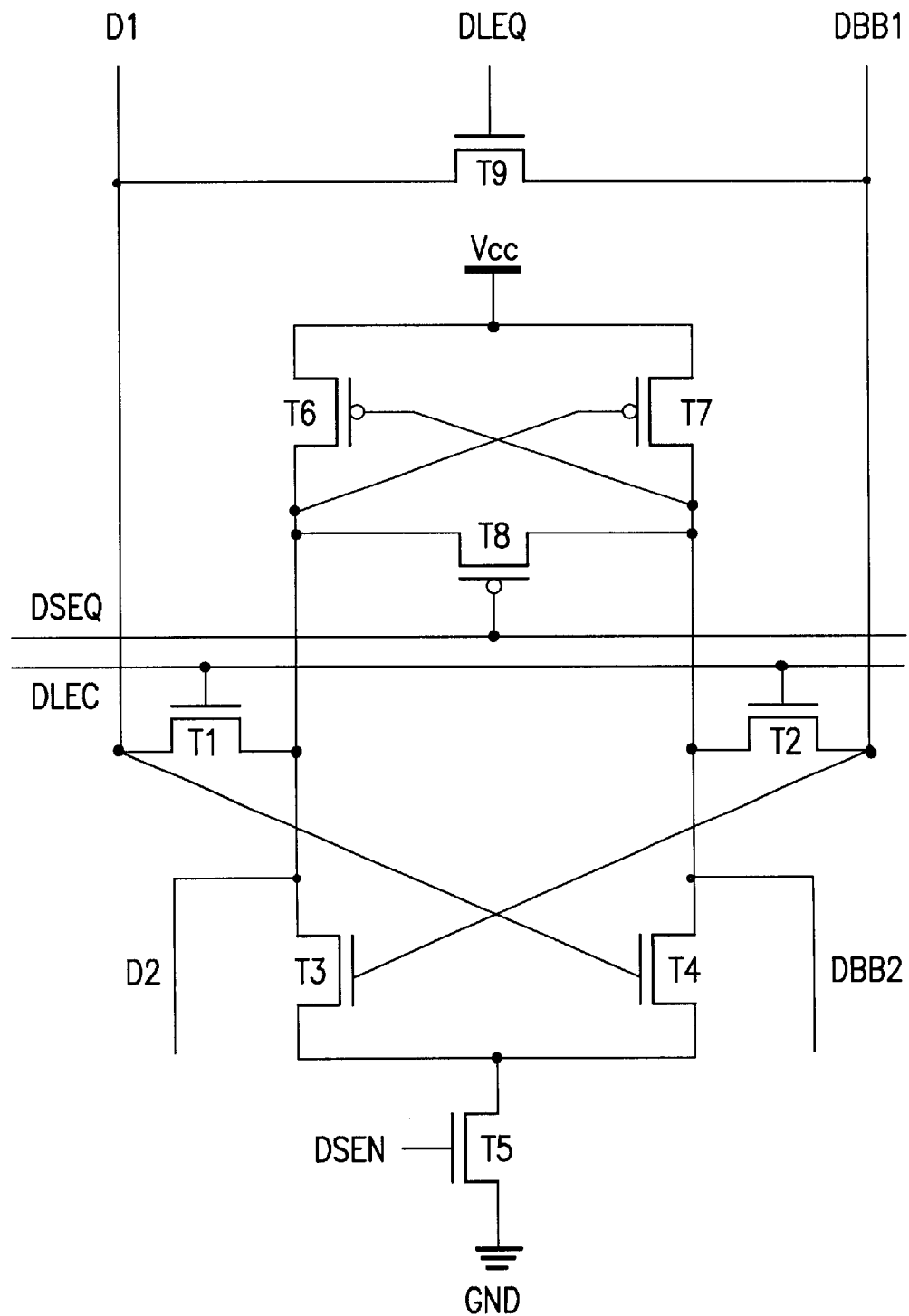
FIG. 16 is a diagram showing a preferred embodiment of a second amplifier of main and redundancy cell areas according to the present invention.

FIG. 16 is a diagram that shows a preferred embodiment of a second amplification stage being the second amplifier and the second redundancy amplifier of the nonvolatile ferroelectric memory. As shown in FIG. 16, in the sensing amplifier for sensing the signal transmitted through the data bus D1 and the data bar bus DBB1 and applying the sensed signal to another data bus D2 and data bar bus DBB2, the second amplifier and a second redundancy amplifier can include a first transistor T1 for switching a signal of the data bus D1, which is applied to its source, a second transistor T2 for switching a signal of the data bar bus DBB1, which is applied to its source, a third transistor T3 whose gate is coupled with the source of the second transistor T2 whose drain is coupled with a drain of the first transistor T1, a fourth transistor T4 whose gate is coupled with an input terminal of the first transistor T1 and drain is coupled with the drain of the second transistor T2.

A fifth transistor T5 has a source coupled with a ground terminal GND and a drain commonly coupled with the sources of the third and fourth transistors. A sixth transistor T6 has a gate coupled with the drain of the second transistor T2, a source coupled with a power source voltage terminal Vcc and a drain coupled with the drain of the first transistor T1. A seventh transistor T7 has a gate coupled with the drain of the first transistor T1, a source coupled with the power source voltage terminal Vcc, and a drain coupled with the drain of the second transistor T2. An eighth transistor T8 equalizes the drain of the sixth transistor T6 with the drain of the seventh transistor T7, and a ninth transistor T9 for equalizing the data bus D1 with the data bar bus DBB1.

The first transistor T1 further acts to allow the amplified signal to be back to the gate of the fourth transistor T4, and the second transistor T2 further acts to allow the amplified signal to be transmitted back to the gate of the third transistor T3. The sixth, seventh and eighth transistors T6, T7 and T8 constitute PMOS transistors while the other transistors constitute NMOS transistors.

The ninth transistor T9 is operated by a data bus equalizing signal DLEQ for equalizing the data bus D1 with the data bar bus DBB1 while the fifth transistor T5 is operated by a sensing amplifier active signal DSEN. The eighth transistor T8 is operated by a sensing amplifier equalizing signal DSEQ, and a latch enable control signal DLEC is applied to the gates of the first and second transistors T1 and T2.

Operations of the aforementioned second amplifier and the second redundancy amplifier will now be described. As shown in FIG. 16, during precharge, the data bus equalizing signal DLEQ for equalizing the data bus D1 with the data bar bus DBB1 and the latch enable control signal DLEC are high while the sensing amplifier equalizing signal DSEQ and the sensing amplifier active signal DSEN are low. Therefore, the data bus D1 and the data bar bus DBB1 for interfacing the output of the first amplifier are precharged to high level.

In a read mode, the sensing amplifier equalizing signal DSEQ and the sensing amplifier signal DSEN are set up at high level while the data bus equalizing signal DLEQ and the latch enable control signal DLEC are set up at low level. In this case, the signals of the data bus D1 and the data bar bus DBB1 are amplified. At this time, the latch enable control signal DLEC for interfacing the output of the second amplifiers becomes low so that the data bus D1 and the data bar bus DBB1 are separated from the data bus D2 and the data bar bus DBB2.

In a write mode, before the sensing amplifier active signal DSEN is changed to high level, the sensing amplifier equalizing signal DSEQ and the latch enable control signal DLEC are set up at high level and the data bus equalizing signal DLEQ is set up low level. Accordingly, the output data to be written in the cell are transmitted to the data bus D1 and the data bar bus DBB1 through the data bus D2 and the data bar bus DBB2.

If the data for writing are transmitted to the data bus D1 and the data bar bus DBB1, the sensing amplifier active signal DSEN is transited to high level while the other signals are maintained. As a result, the second amplifiers become active so that the amplified data (e.g., data to be written in the cell) are transmitted to the first amplifier to write the data through the main and redundancy bitlines.

Figure 17:
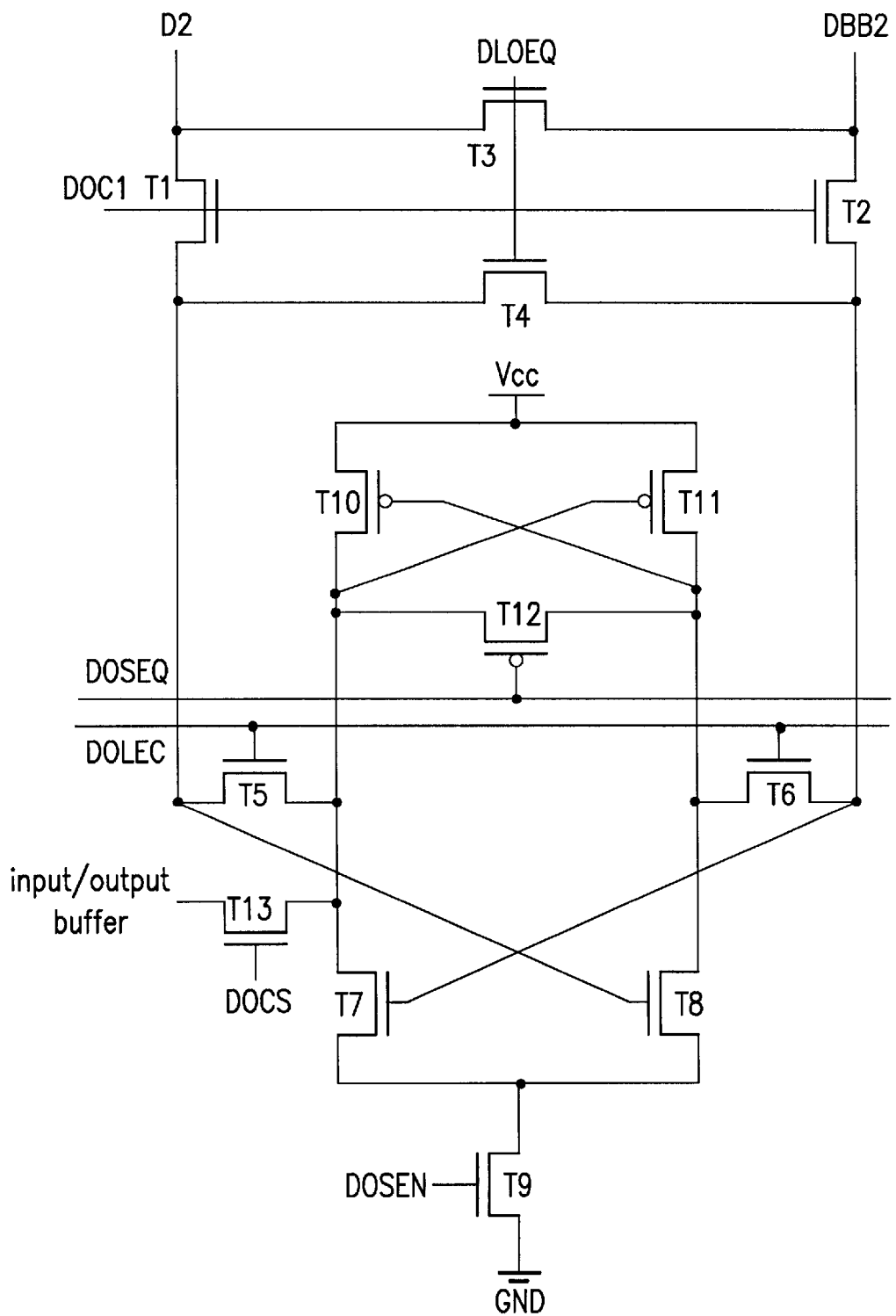
FIG. 17 is a diagram showing a preferred embodiment of third amplifier of main and redundancy cell areas according to the present invention.

FIG. 17 is a schematic diagram shown a third amplification stage being the third amplifier and the third redundancy amplifier of the nonvolatile ferroelectric memory device according to the present invention. As shown in FIG. 17, the third amplifiers amplify the signal transmitted through the data bus D2 and the data bar bus DBB2 and transmits the amplified signal to the input/output pad through the column redundancy driving circuit 125.

The third amplifier includes a first transistor T1 for switching the signal transmitted through the data bus D2, a second transistor T2 for switching the signal transmitted through the data bar bus DBB2, a third transistor T3 for equalizing a source of the first transistor T1 with a source of the second transistor T2, a fourth transistor T4 for equalizing a drain of the first transistor T1 with a drain of the second transistor T2, a fifth transistor T5 for switching a signal of the data bus D2, which is applied to its source, and a sixth transistor T6 for switching a signal of the data bar bus DBB2, which is applied to its source. A seventh transistor T7 has a gate coupled with the source of the sixth transistor T6 and a drain coupled with a drain of the fifth transistor T5. An eighth transistor T8 has a gate coupled with an input terminal of the fifth transistor T5 and a drain coupled with the drain of the sixth transistor T6. A ninth transistor T9 having a source coupled with a ground terminal GND and a drain commonly coupled with sources of the seventh and eighth transistors T7 and T8, and a tenth transistor T10 has a gate coupled with the drain of the sixth transistor T6, a source coupled with a power source voltage terminal Vcc and a drain coupled with the drain of the fifth transistor T5. An eleventh transistor T11 has a gate coupled with the drain of the fifth transistor T5, a source coupled with the power source voltage terminal, and a drain coupled with the drain of the sixth transistor T6. A twelfth transistor T12 equalizes the drain of the tenth transistor T10 with the drain of the eleventh transistor T11, and a thirteenth transistor T13 switches the amplified signal to the input/output pad.

The third transistor T3 and the fourth transistor T4 are controlled by a data bus equalizing signal DLOEQ for equalizing the data bus D2 and the data bar bus DBB2. The fifth transistor T5 further acts to allow the amplified signal to be fed back to the gate of the sixth transistor T6, and the sixth transistor T6 further acts to allow the amplified signal to be fed back to the gate of the fifth transistor T5. The ninth transistor T9 is operated by a sensing amplifier active signal DOSEN while the twelfth transistor T12 is operated by a sensing amplifier equalizing signal DOSEQ. A latch enable control signal DOLEC is applied to the gates of the fifth and sixth transistors T5 and T6.

The first, second, third and fourth transistors T1, T2, T3 and T4 switch the data of the data bus and the data bar bus and at the same time equalize these buses. Each of the switches described in the preferred embodiments of the amplification stage includes a first transistor for switching the signal of the data bus, a second transistor for switching the signal of the data bar bus, a third transistor for equalizing input terminals of the first and second transistors, and a fourth transistor for equalizing output terminals of the first and second transistors.

Operations of the third amplifier and the third redundancy will now be described. As shown in FIG. 17, during precharge, the data bus D2 and the data bar bus DBB2 are precharged to high level. At this time, the control signal DOC1 applied to the gates of the first and second transistors T1 and T2 and the control signal DLOEQ applied to the gates of the third and fourth transistors T3 and T4 are high while the sensing amplifier active signal DOSEN, the sensing amplifier equalizing signal DOSEQ and the latch enable control signal DOLEC are low.

In a read mode, only the control signal DLOEQ applied to the gates of the third and fourth transistors T3 and T4 becomes low while the other signals DOC1, DLOEQ, DOSEN, DOSEQ and a control signal DOCS applied to the gate of the thirteenth transistor T13 are set up at high level so that the signals of the data bus D2 and the data bar bus DBB2 are amplified and then applied to the input/output pad or to the input/output pad through the column redundancy drawing circuit and the data input/output buffer.

In a write mode, before the sensing amplifier active signal DOSEN is changed to high level, the control signals are controlled so that the signals from the input/output buffer (e.g., data for writing) are transmitted to the data bus D2 and the data bar bus DBB2 of the third amplifiers. If the data for writing are transmitted to the data bus D2 and the data bar bus DBB2, the sensing amplifier active signal DOSEN is transited to high level at the state that the other signals are maintained unchanged.

As a result, the third amplifier becomes active so that the amplified signals are transmitted to the second amplifiers through the data bus D2 and the data bar bus DBB2. The second amplifiers also amplify the signals transmitted through the data bus D2 and the data bar bus DBB2 under the control of the control signals and transmits the amplified signals through to the first amplifier through the data bus D1 and the data bar bus DBB1. Thereafter, the first amplifiers sense the input signals and transmits the sensed signals to the cell through the main bitline. Finally, the writing operation is completed.

Figure 18:
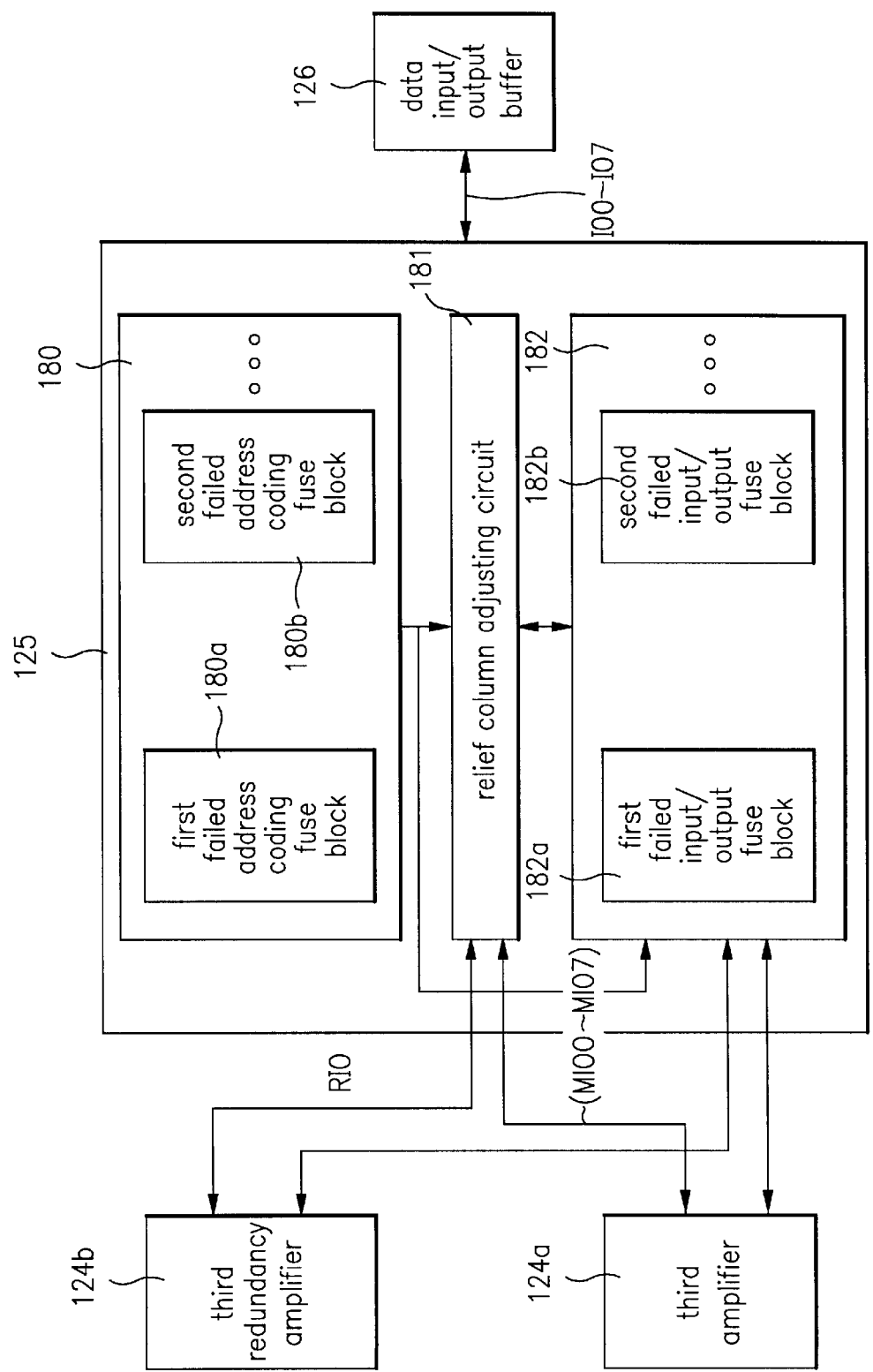
FIG. 18 is a diagram showing a preferred embodiment of a column redundancy driving circuit according to the present invention.

A preferred embodiment of a column redundancy driving circuit according to the present invention will be now described. As shown in FIG. 18, the column redundancy driving circuit 125 includes a failed column address coder 180, a failed input/output coder 182, and a relief column adjusting circuit 181. The failed column address coder 180 includes a plurality of failed address coding fuse blocks 180a, 180b, . . . for generating an active signal if a plurality of failed column addresses are input. The failed input/output coder 182 includes a plurality of input/output coding fuse blocks 182a and 182b preferably in one-to-one correspondence with the failed address coding fuse blocks 180a, 180b, . . . The relief column adjusting circuit 181 activates the redundancy column through the active signal and inactivates the failed column to control normal column operations and column relief operations. Each of the failed address coding fuse blocks 180a, 180b, . . . preferably generates an active signal for relieving one failed column address.

Figure 19:
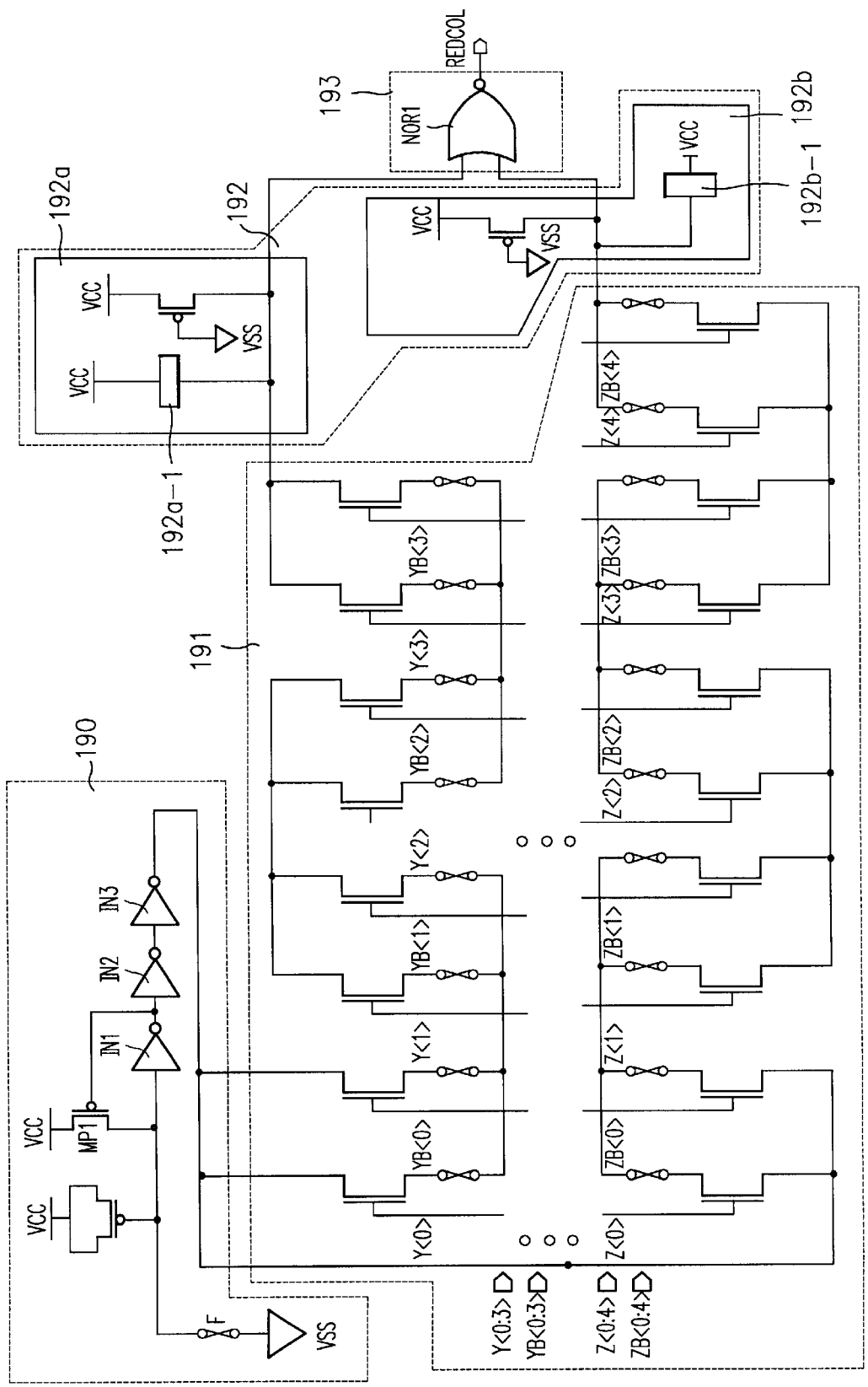
FIG. 19 is a circuit diagram that shows a failed column address coder of FIG. 18.

The failed column address coder 180 will now be described. As shown in FIG. 19, a failed address coding fuse (e.g., first-nth failed address coding fuse blocks 180a, . . . 180n) for outputting one failed column active signal of the failed column address coder 180 includes a relief active signal generator 190, an address fuse cut coding block 191, an address generator 192, and an address detector 193.

The relief active signal controller 190 preferably includes a fuse F1, a pull-up capacitor, first, second and third inverters IN1, IN2 and IN3, and a first PMOS transistor MP1. The pull-up capacitor is a PMOS capacitor having one end (e.g., gate terminal) coupled with one end of the fuse F1 and its other end (e.g., source and drain terminal) coupled with VCC terminal. The first, second and third inverters IN1, IN2 and IN3 are coupled in series to one end of the fuse F1. The other end of the fuse F1 is coupled with a ground terminal VSS. The first PMOS transistor MP1 is formed between the VCC terminal and the one end of the fuse F1, and an output signal of the first inverter IN1 is applied to a gate terminal of the first PMOS transistor MP1.

The address fuse cut coding block 191 preferably includes a plurality of unit address fuse cut coding blocks. At this time, the unit address fuse cut coding block preferably includes eight NMOS transistors and eight fuses that are respectively coupled in series with each other. In the eight NMOS transistors and fuses, two NMOS transistors and two corresponding fuses that are couple in series with each other constitute one pair. Also, address selection signals (Y<0>, YB<0>, . . . , Y<3>, YB<3>, . . . , Z<0>, ZB<0>, . . . , Z<3>, ZB<3>, . . . ) are input to the respective NMOS transistors. Signals of phases opposite to each other are input to the respective pairs of NMOS transistors. Both outer ends of the pairs of the NMOS transistor and the corresponding fuse are coupled together. Further, one end or both ends of the respective pairs of the NMOS transistor and the corresponding fuse is coupled with one end of its neighboring pair or pairs.

The address generator 192 includes a plurality first and second address generators 192a and 192b. Each of the first and second address generators 192a and 192b includes one pull-up switch 192a-1 or 192b-1 and one PMOS transistor coupled in parallel with each other. The pull-up switch and the PMOS transistor are coupled to the output terminal of the respective address fuse cut coding block. Two unit address fuse cut coding blocks and the first and second address generators 192a and 192b are shown, however, the present invention is not intended to be so limited.

The address detector 193 includes a first NOR gate NOR1 that performs logic OR of signals of the respective address generator 192 and inverts a resultant value. A column relief address signal REDCOL is output through the first NOR gate NOR1.

As described above, the respective address fuse cut coding block includes first to eighth NMOS transistors and first to eighth fuses. The NMOS transistors and the fuses are one-to-one coupled in series.

As shown in FIG. 19, one end of the first NMOS transistor is coupled with one end of the second NMOS transistor. One end of each of the first to fourth fuses are coupled with one another. One end of the third to sixth NMOS transistors are coupled with one another, and one end of the fifth to eighth NMOS transistors. One ends of the seventh and eighth NMOS transistors are coupled with an output terminal.

The address signals (Y<0>, YB<0>, Y<1>, YB<1>, Y<2>, YB<2>, Y<3>, YB<3>) are input in turn to the NMOS transistors of one unit address fuse cut coding block.

The first and second NMOS transistors preferably have phases opposite to each other, the third and fourth NMOS transistors have phases opposite to each other, fifth and sixth NMOS transistors preferably have phases opposite to each other, and seventh and eighth NMOS transistors preferably have phases opposite to each other.

When a failed column address occurs, the fuse F1 of the relief active signal generator 190 is cut. A high signal is applied to one node of the first PMOS transistor MP1 and low signal is finally output through the third inverter IN3.

The unit address fuse cut coding block preferably maintains the fuse coupled with one of a pair of NMOS transistors to which a failed address signal is applied while cutting the fuse coupled with the other NMOS transistor having opposite phase. Also, the unit address fuse cut coding block cuts the fuse coupled with one of a pair of NMOS transistors, which receives an address signal not failed, while maintaining the fuse coupled with the other NMOS transistor having opposite phase.

When the relief active signal generator 190 and the address fuse cut coding block 191 as described above are operated, low signal is output to the unit fuse cut coding block when the failed address occurs. If low signal is finally output to the unit fuse cut coding block, high signal is applied to the address detector 193 including the first NOR gate NOR1, so that the failed address is detected and a failed column address active signal is output.

Figure 20:
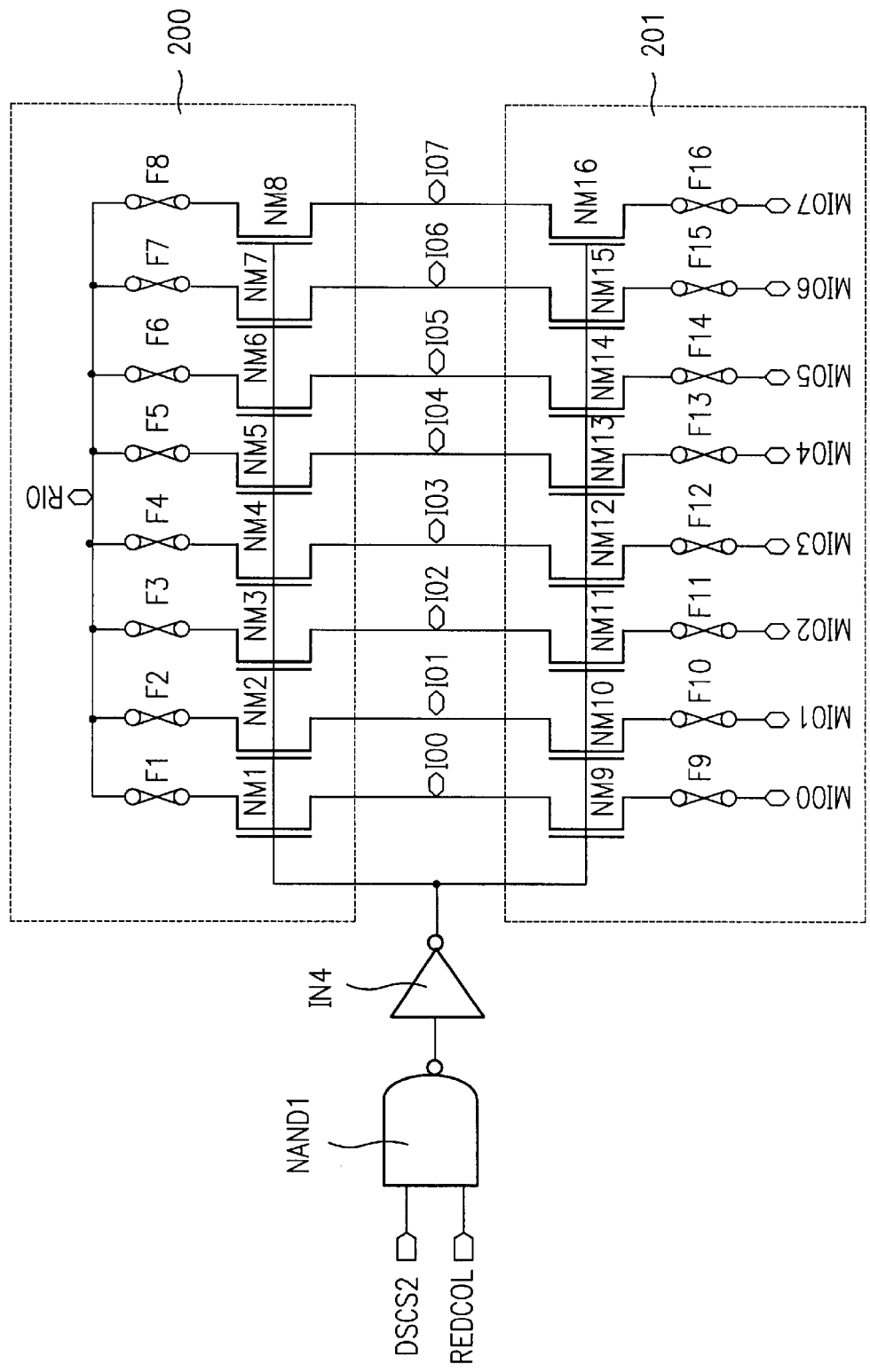
FIG. 20 is a circuit diagram that shows a failed input/output coder of FIG. 18.

As shown in FIG. 20, the failed input/output coder 182 includes a first NAND gate NAND1 for performing logic AND of the failed column address active signal REDCOL and a relief control signal DSCS2 of the failed address coder 180 and inverting a resultant value. A fourth inverter IN4 is for inverting an output signal of the first NAND gate NAND1, and a first address fuse cutter 200 to which the inverted signal is applied is provided between the third redundancy amplifier 124b and the data bus of the data input/output buffer 126 for cutting addresses of the redundancy cell array block. A second address fuse cutter 201, which receives the inverted signal, is provided among an input/output terminal RIO of the third amplifier and input/output terminals MI00, MI01, MI02, MI03, MI04, MI05, MI06 and MI07 of the data input/output buffer 126 for cutting addresses of the main cell array block.

The first address fuse cutter 200 includes a plurality of fuses F1,F2,F3,F4,F5,F6,F7 and F8 having one ends coupled with the input/output terminals of the third amplifier 124a, and a plurality of NMOS transistors NM1,NM2,NM3, NM4,NM5,NM6,NM7 and NM8 sequentially provided between the input/output terminals I00~I07 of the data input/output buffer 126 and other ends of the respective fuses. The second address fuse cutter 201 includes a plurality of fuses F9,F10,F11,F12,F13,F14,F15 and F16 coupled with the input/output terminals MI00~MI07 of the third amplifier 124b, and a plurality of NMOS transistors NM9, NM10,NM11,NM12,NM13,NM14,NM15 and NM16 sequentially provided between the input/output terminals I00~I07 of the data input/output buffer 126 and other ends of the respective fuses.

As shown in FIG. 20, F1 and NM1 of the first address fuse cutter 200 are coupled in series with NM9 and F9 of the second address fuse cutter 201, and the input/output terminal I00 is disposed between F1, NM1 and NM9, F9. Likewise, F2 and NM2 are coupled in series with NM10 and F10, F3 and NM3 with NM11 and F11, F4 and NM4 with NM12 and F12, F5 and NM5 with NM13 and F13, F6 and NM6 with NM14 and F14, F7 and NM7 with NM15 and F15, and F8 and NM8 with NM16 and F16.

When a high signal is applied to REDCOL and DSCS2, low signal is output through NAND1 and high signal is output through IN4 so that the respective fuses of the first address fuse cutter 200 and the second address fuse cutter 201 are mutually exclusively cut (e.g., contrarily) in case that the NMOS transistors are all turned on. Thus, if F1 coupled with the input/output terminal of the third redundancy amplifier 124b is cut, F9 is coupled with the input/output terminal MIO0 of the third amplifier 123a of the main area. If F8 is coupled with the input/output terminal RI0 of the third redundancy amplifier 124b, F16 is cut. The fuse coupled with the failed column address of the main area is only cut while the fuse coupled with the cut fuse in series and coupled with the input/output terminal RI0 of the third redundancy amplifier 124b is maintained.

Figure 21:
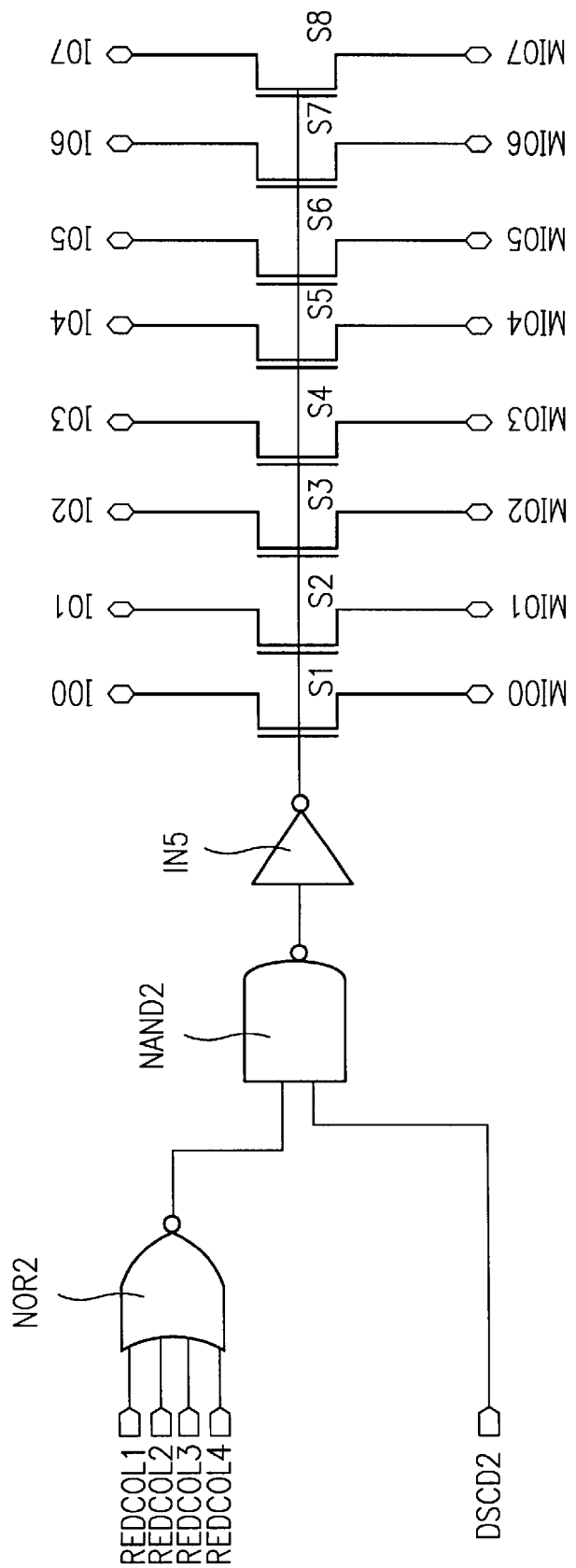
FIG. 21 is a circuit diagram that shows a column redundancy adjusting circuit of FIG. 18.

As shown in FIG. 21, the relief column adjusting circuit 181 includes a second NOR gate NOR2 for performing logic OR of a plurality of failed column address active signals REDCOL1, REDCOL2, REDCOL3 and REDCOL4 output from the failed column address coder 180 and inverting a resultant value, a second NAND gate NAND2 for performing logic AND of output signals of the second NOR gate NOR2 and the relief control signal DSCS2 and inverting a resultant value, and a fifth inverter IN5 for inverting output signals of the second NAND gate NAND2. Switching elements S1~S8, which receive output signals of the fifth inverter IN5, are sequentially provided between the input/output terminals I00~I07 of the data input/output buffer 126 and the input/output terminals MI00~MI07 of the third amplifier 124a of the main area. As shown in FIG. 21, the switching elements S1~S8 are NMOS transistors. However, the present invention is not intended to be so limited.

If there is at least one high signal in the failed column address active signals REDCOL1, REDCOL2, REDCOL3 and REDCOL4, the relief column adjusting circuit 181 generates low signal through the second NAND gate NAND2 and the fifth inverter IN5. As a result, the switching elements are all turned off. In other words, if the failed column address active signal is not generated from the failed column address coder 180 because the failed column address active signals are all low and the relief control signal DSCS2 is high, the switching elements S1~S8 are all turned on so that data input/output operation can be performed through the input/output terminals I00~I07 of the data input/output buffer 126 and the input/output terminals MI00~MI007 of the third amplifier 124a of the main area. On the contrary, if there is at least one high signal in the failed column address active signals REDCOL1, REDCOL2, REDCOL3 and REDCOL4, low signal is output to the second NOR gate through the second NAND gate NAND2 and the fifth inverter IN5. As a result, the input/output terminals I00~I07 of the data input/output buffer 126 and the input/output terminals MI00~MI007 of the third amplifier 124a of the main area are cut, and do not perform data input/output operations.

A preferred embodiment of a method for relieving a failed address of a nonvolatile ferroelectric memory device will now be described. The preferred embodiment of the method of relieving a failed address can be used with the preferred embodiment of a nonvolatile ferroelectric memory device having a column redundancy circuit described above.

Figure 22:
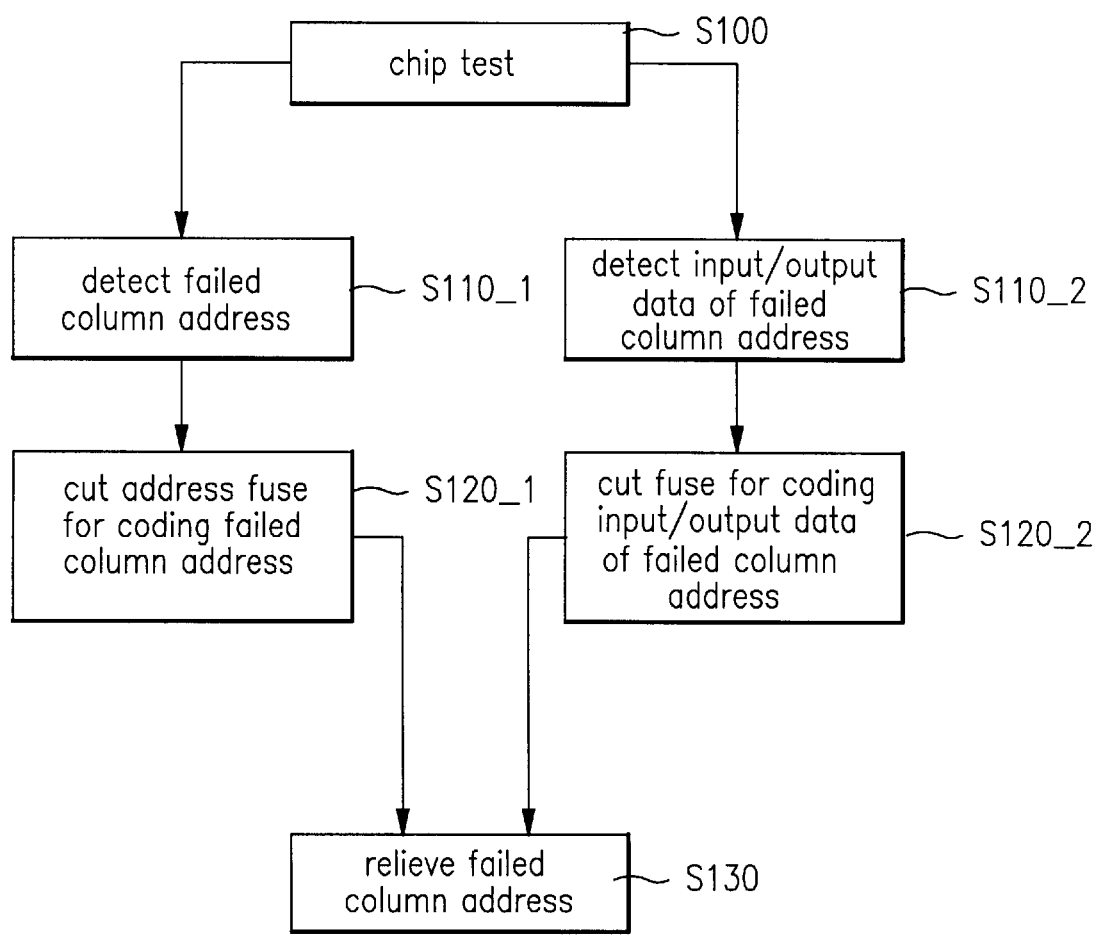
FIG. 22 is a flowchart showing a preferred embodiment of a method for relieving a failed address in a nonvolatile ferroelectric memory device with a column redundancy circuit according to the present invention.

FIG. 22 is a flowchart showing the preferred embodiment method for relieving a failed address in a nonvolatile ferroelectric memory device with a column redundancy circuit according to the present invention. As shown in FIG. 92 in step S100 a process for relieving a failed address performs a chip test after the wafer fabrication process (not shown).

From step S100, the process continues to steps S110_1 and S110_2, where a failed column address is detected and input/output data of the failed column address is detected, respectively. From step S110_1, the process continues to step S120_1 where a failed column address active signal is generated by cutting a fuse through a failed address fuse cutter so as to code the failed column address. From step 110_2, the process continues to a step S120_2 where a failed input/output active signal is generated by cutting a fuse through a failed input/output fuse cutter so as to code corresponding failed input/output data. From steps S120_1 and S120_2, the process continues to step S130 where a corresponding failed column address is relieved by synthesizing the failed address active signal and the failed input/output active signal through a relief column adjusting circuit. Thus, if a failed column address is detected in the main cell array block, the failed column address is substituted for the column address of the redundancy cell array block and data of the column address are transmitted to the data input/output buffer through the first, second and third redundancy amplifiers under the control of the column redundancy driving circuit.

As described above, preferred embodiments of a nonvolatile ferroelectric memory device with a column redundancy circuit and method for relieving a failed address thereof have various advantages. The preferred embodiments use a common data bus for data read and write operations. Since the column redundancy circuit is provided with the amplifiers of a hierarchical structure in which one data bus is commonly used for data reading and writing operations, a size of a relief circuit can be reduced or minimized, which reduces load of the data bus and increases a speed of relief operations. Further, a redundancy cell array has the same configurations of a main cell array to increase operation stability, lifetime and fabrication consistency. In addition, since the number of the sensing amplifier array blocks provided between the respective cell array blocks driven by adjacent split wordline driver blocks can be reduced from (e.g., two to one), a layout area of the chip and the sensing amplifier array can be reduced, thereby achieving efficient chip design and improved performance characteristics.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A ferroelectric memory device, comprising:
    main cell array block and a redundancy cell array block having cell arrays including wordlines and bitlines perpendicular to the wordlines, wherein the redundancy cell array block corrects a selected failed column address of the main cell array block;
    a column reference cell array block;
    an amplifier that amplifies bitline signals of the main cell array block using a first common data bus for data reading and writing operations;
    a redundancy amplifier that amplifies bitline signals of the redundancy cell array block using a second common data bus for data reading and writing operations; and
    a column redundancy driving circuit coupled to the amplifiers that substitutes a column of the redundancy cell array block responsive to the failed selected column address of the main cell array block.

2. The ferroelectric memory device of claim 1, further comprising an input/output buffer that transmits column data to an input/output pad.

3. The ferroelectric memory device of claim 2, wherein the column reference cell array block comprises:
    a cell block selection switch between first and second areas of the column reference cell array block having one electrode coupled with a bitline of the first area and another electrode coupled with a bitline of the second area;
    a first level shift tracer coupled with even numbered switching elements of the cell block selection switch to output a reference signal to the amplifiers; and
    a second level shift tracer coupled with odd numbered switching elements of the cell block selection switch to output the reference signal to the amplifiers.

4. The ferroelectric memory device of claim 1, wherein the redundancy amplifier comprises:
    a first redundancy amplifier that amplifies the bitline signals of the redundancy cell array block;
    a first data bus that transfers a first signal to and from the first redundancy amplifier for reading and writing of data, respectively;
    a second redundancy amplifier that amplifies the first signal of the first data bus;
    a second data bus that transfers a second signal to and from the second redundancy amplifier for reading and writing of data, respectively;
    a third redundancy amplifier that amplifies the second signal of the second data bus.

5. The ferroelectric memory device of claim 1, wherein the wordlines are split wordlines, and wherein the main cell array block and the redundancy cell array block each comprises:
    split wordline driver blocks that drives the split wordlines;
    a cell block selection switch arranged between first and second areas of one cell array corresponding to one split wordline driver block, having one electrode coupled with a bitline of the first area and other electrode coupled with a bitline of the second area; and
    first and second sensing amplifier arrays that sense data of a selected one of the first area and the second area.

6. The ferroelectric memory device of claim 5, wherein the first sensing amplifier array includes sensing amplifiers over the redundancy cell array block and coupled with even numbered switching elements in the cell block selection switch, and wherein the second sensing amplifier array includes sensing amplifiers under the redundancy cell array block and coupled with odd numbered switching elements of the switching elements.

7. The ferroelectric memory device of claim 5, wherein the sensing amplifier array of the main cell array block and the redundancy cell array block is coupled to two cell array blocks when the sensing amplifier array is between the two cell array blocks each driven by different split wordline driver blocks.

8. The ferroelectric memory device of claim 1, wherein the column redundancy driving circuit comprises:
    a failed column address coder having a plurality of failed address coding fuse blocks that generate a relief column address active signal coupled to receive a plurality of failed column addresses;

a failed input/output coder that includes a plurality of input/output coding fuse blocks each corresponding to one of the failed address coding fuse blocks; and a relief column adjusting circuit that activates the redundancy column through the active signal and inactivates a failed column of the selected failed column address.

9. The ferroelectric memory device of claim 8, wherein each of the failed address coding fuse blocks comprises:

a relief active signal generator that outputs a control signal;

a plurality of address fuse cut coding blocks that cut a fuse to code a failed address responsive to the control signal;

an address generator that outputs address signals output by each address fuse cut coding block; and an address detector that detects the address signals by logically processing the address signals output by the address generator.

10. The ferroelectric memory device of claim 9, wherein the relief active signal generator comprises:

a fuse;

a capacitor between one end of the fuse and a voltage terminal;

first, second and third inverters coupled in series to the one end of the fuse; and a first transistor between the voltage terminal and other end of the fuse that receives an output signal of the first inverter.

11. The ferroelectric memory device of claim 9, wherein the address fuse cut coding block includes a plurality of unit address fuse cut coding blocks to which n bit address signals are applied.

12. The ferroelectric memory device of claim 11, wherein the unit address fuse cut coding block comprises first and second series coupled transistors and fuses, wherein the series coupled transistors and fuses are coupled in n pairs.

13. The ferroelectric memory device of claim 12, wherein adjacent pairs of the n pairs are coupled together using at least one end.

14. The ferroelectric memory device of claim 9, wherein the address generator comprises:

a pull-up switch; and a transistor coupled in parallel with the pull-up switch between the voltage terminal and an output terminal of the unit address fuse cut coding block.

15. The ferroelectric memory device of claim 9, wherein the address detector comprises a first NOR gate that logically NORs signals of the respective address generator.

16. The ferroelectric memory device of claim 8, wherein the failed input/output coding fuse blocks comprises:

a first NAND gate that logically NANDs the failed column address active signal and the relief control signal of the failed address coder;

a fourth inverter that inverts an output signal of the first NAND gate;

a first address fuse cutter that receives an output signal of the fourth inverter coupled between the redundancy amplifier and input/output terminals of a data input/ output buffer to cut addresses of the redundancy cell array block; and a second address fuse cutter that receives the output signal of the fourth inverter coupled between input/output terminals of the amplifier to cut addresses of the main cell array block.

17. The ferroelectric memory device of claim 16, wherein the first address fuse cutter comprises:

a plurality of fuses having first ends coupled with the input/ output terminals of the redundancy amplifier; and a plurality of transistors coupled between the input/output terminals of the data input/output buffer and second ends of a corresponding one of the fuses.

18. The ferroelectric memory device of claim 16, wherein the second address fuse cutter comprises:

a plurality of fuses having first ends coupled with the input/output terminals of the amplifier; and a plurality of transistors sequentially coupled between the input/output terminals of the data input/output buffer and second ends of a corresponding one of the fuses.

19. The ferroelectric memory device of claim 8, wherein the relief column adjusting circuit comprises:

a second NOR gate that performs logic NOR of a plurality of failed column address active signals output from the failed column address coder;

a second NAND gate that performs logic NAND of output signals of the second NOR gate and a relief control signal;

a fifth inverter that inverts an output signal of the second NAND gate; and switching elements that receive an output signal of the fifth inverter, each coupled between input/output terminals of a data input/output buffer and input/output terminals of the amplifier.

20. A semiconductor memory device, comprising:

main cell array block and a redundancy cell array block having cell arrays including wordlines and bitlines perpendicular to the wordlines, wherein the redundancy cell array block corrects a selected failed column address of the main cell array block;

an amplifier that amplifies bitline signals of the main cell array block using a first common data bus for data reading and writing operations;

a redundancy amplifier that amplifies bitline signals of the redundancy cell array block using a second common data bus for data reading and writing operations, wherein the redundancy amplifier comprises, first redundancy amplifier that amplifies the bitline signals of the redundancy cell array block, first data bus that transfers a first signal to and from the first redundancy amplifier for reading and writing of data, respectively, and a second redundancy amplifier that amplifies the first signal of the first data bus; and a column redundancy driving circuit coupled to the amplifiers that substitutes a column of the redundancy cell array block responsive to the failed selected column address of the main cell array block.

21. The semiconductor memory device of claim 20, wherein the redundancy amplifier comprises:

a second data bus that transfers a second signal to and from the second redundancy amplifier for reading and writing of data, respectively;

a third redundancy amplifier that amplifies the second signal of the second data bus.

22. The semiconductor memory device of claim 20, wherein the column redundancy driving circuit comprises:

a failed column address coder having a plurality of failed address coding fuse blocks that generate a relief column address active signal coupled to receive a plurality of failed column addresses;

a failed input/output coder that includes a plurality of input/output coding fuse blocks each corresponding to one of the failed address coding fuse blocks; and a relief column adjusting circuit that activates the redundancy column through the active signal and inactivates a failed column of the selected failed column address, and wherein the semiconductor memory device is a ferroelectric memory device.

23. A ferroelectric memory device, comprising:

main cell array block and a redundancy cell array block having cell arrays including split wordlines and bitlines perpendicular to the split wordlines, wherein the redundancy cell array block corrects a selected failed column address of the main cell array block, wherein the main cell array block and the redundancy cell array block each comprises split wordline driver blocks that drives the split wordlines;

an amplifier that amplifies bitline signals of the main cell array block using a first common data bus for data reading and writing operations;

a redundancy amplifier that amplifies bitline signals of the redundancy cell array block using a second common data bus for data reading and writing operations; and a column redundancy driving circuit coupled to the amplifiers that substitutes a column of the redundancy cell array block responsive to the failed selected column address of the main cell array block.

24. The ferroelectric memory device of claim 23, wherein a cell comprises:

a first and a second split wordlines extending along one direction at first intervals;

a first and a second bitlines extending along a second direction to cross the first and second split wordlines at second intervals;

a first transistor having a second electrode coupled to the first bitline and a control electrode coupled to the first split wordline;

a first ferroelectric capacitor between a first electrode of the first transistor and the second split wordline;

a second transistor having a second electrode coupled to the second bitline and a control electrode coupled to the second split wordline; and a second ferroelectric capacitor between a first electrode of the second transistor and the first split wordline.

25. The ferroelectric memory device of claim 23, wherein the column redundancy driving circuit comprises:

a failed column address coder having a plurality of failed address coding fuse blocks that generate a relief column address active signal coupled to receive a plurality of failed column addresses;

a failed input/output coder that includes a plurality of input/output coding fuse blocks each corresponding to one of the failed address coding fuse blocks; and a relief column adjusting circuit that activates the redundancy column through the active signal and inactivates a failed column of the selected failed column address.

26. An ferroelectric memory device, comprising:

main cell array block and a redundancy cell array block having cell arrays including wordlines and bitlines perpendicular to the wordlines, wherein the redundancy cell array block corrects a selected failed column address of the main cell array block;

an amplifier that amplifies bitline signals of the main cell array block using a first common data bus for data reading and writing operations;

a redundancy amplifier that amplifies bitline signals of the redundancy cell array block using a second common data bus for data reading and writing operations;

a column redundancy driving circuit coupled to the amplifiers that substitutes a column of the redundancy cell array block responsive to the failed selected column address of the main cell array block, wherein the column redundancy driving circuit comprises, a failed column address coder having a plurality of failed address coding fuse blocks that generate a relief column address active signal coupled to receive a plurality of failed column addresses;

a failed input/output coder that includes a plurality of input/output coding fuse blocks each corresponding to one of the failed address coding fuse blocks; and a relief column adjusting circuit that activates the redundancy column through the active signal and inactivates a failed column of the selected failed column address.

* * * * *